United States Patent
Watanabe et al.

(10) Patent No.: US 8,956,740 B2
(45) Date of Patent: Feb. 17, 2015

(54) FILM-FORMING INK, FILM-FORMING METHOD, LIQUID DROPLET DISCHARGING DEVICE, METHOD FOR PREPARING LIGHT-EMITTING ELEMENT, LIGHT-EMITTING ELEMENT, LIGHT-EMITTING DEVICE AND ELECTRONIC APPARATUS

(75) Inventors: Shotaro Watanabe, Chino (JP); Masashi Goto, Kyoto (JP)

(73) Assignee: Seiko Epson Corporation, Tokyo (JP)

( * ) Notice: Subject to any disclaimer, the term of this patent is extended or adjusted under 35 U.S.C. 154(b) by 411 days.

(21) Appl. No.: 13/213,687

(22) Filed: Aug. 19, 2011

(65) Prior Publication Data
US 2012/0049172 A1    Mar. 1, 2012

(30) Foreign Application Priority Data

Aug. 24, 2010 (JP) ................. 2010-187173
Aug. 24, 2010 (JP) ................. 2010-187174

(51) Int. Cl.
| H01L 51/54 | (2006.01) |
| H01L 51/56 | (2006.01) |
| B05C 5/00 | (2006.01) |
| H01L 51/00 | (2006.01) |
| H01L 51/50 | (2006.01) |

(52) U.S. Cl.
CPC ......... *H01L 51/0007* (2013.01); *H01L 51/0039* (2013.01); *H01L 51/5056* (2013.01); *Y10S 428/917* (2013.01)
USPC ...... 428/690; 428/917; 257/40; 257/E51.026; 427/66

(58) Field of Classification Search
None
See application file for complete search history.

(56) References Cited

U.S. PATENT DOCUMENTS

| 6,582,504 B1 * | 6/2003 | Fujita ................. 106/311 |
| 6,878,312 B1 | 4/2005 | Kanbe et al. |
| 2004/0109051 A1 * | 6/2004 | Bright et al. ............... 347/95 |
| 2005/0156148 A1 | 7/2005 | Kanbe et al. |
| 2006/0045959 A1 | 3/2006 | Yasukawa et al. |
| 2008/0305245 A1 | 12/2008 | Kanbe et al. |
| 2009/0186161 A1 | 7/2009 | Kanbe et al. |
| 2010/0102299 A1 | 4/2010 | Murase et al. |
| 2011/0114926 A1 * | 5/2011 | Okabe et al. ............ 257/40 |
| 2012/0263867 A1 | 10/2012 | Kanbe et al. |

FOREIGN PATENT DOCUMENTS

| JP | A-2004-179144 | 6/2004 | |
| JP | A-2006-66294 | 3/2006 | |
| JP | A-2006-278214 | 10/2006 | |
| JP | A-2008-077958 | 4/2008 | |
| JP | A-2009-191232 | 8/2009 | |
| JP | A-2010-138077 | 6/2010 | |
| WO | WO 00/59267 A1 | 10/2000 | |
| WO | WO 2008/090969 A1 | 7/2008 | |
| WO | WO 2009/087966 A1 | 7/2009 | |
| WO | WO 2009109738 A1 * | 9/2009 | ........ H01L 51/00 |
| WO | WO 2010/018388 A1 | 2/2010 | |
| WO | WO 2010018851 A1 * | 2/2010 | ........ H01L 51/50 |

* cited by examiner

*Primary Examiner* — Andrew K Bohaty
(74) *Attorney, Agent, or Firm* — Oliff PLC

(57) ABSTRACT

A film-forming ink includes: film-forming materials containing a π-conjugated compounds; and a liquid medium which is capable of dissolving or dispersing the film-forming material and containing a compound represented by the following formula (I), wherein the compound is one in which the substituent of at least one of $R^1$ to $R^6$ is a linear or branched alkyl group, and the molecular structure of the one substituent is larger than the molecular structure of another substituent, and thus, the molecular weight of the whole molecule is biased towards the side where the one substituent is present.

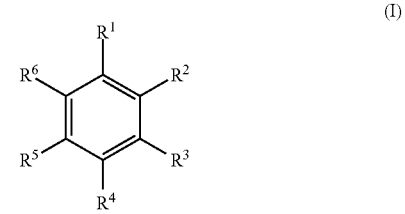

(I)

11 Claims, 5 Drawing Sheets

FILM-FORMING INK, FILM-FORMING METHOD, LIQUID DROPLET DISCHARGING DEVICE, METHOD FOR PREPARING LIGHT-EMITTING ELEMENT, LIGHT-EMITTING ELEMENT, LIGHT-EMITTING DEVICE AND ELECTRONIC APPARATUS

BACKGROUND

1. Technical Field

The present invention relates to a film-forming ink, a film-forming method, a liquid droplet discharging device, a method for preparing a light-emitting element, a light-emitting element, a light-emitting device, and an electronic apparatus.

2. Related Art

Organic electroluminescence elements (organic EL elements) are light-emitting elements each composed of a positive electrode, a negative electrode, and at least one light-emitting organic layer (light-emitting layer) interposed between them. In this light-emitting element, by applying an electric field between the negative electrode and the positive electrode, electrons and holes are injected from the negative electrode and the positive electrode, respectively, to the light-emitting layer, where they are recombined to form excitons in the light-emitting layer, and then when the excitons return to the ground state, energy is emitted in the form of light.

Generally, in the organic EL element, a hole injecting layer is provided on the positive electrode, and a hole transporting layer or a light-emitting layer is provided on the hole injecting layer.

As a method for forming these layers (film-forming method), there is known a method involving a film-forming ink in which film-forming materials are dissolved or dispersed (see, for example, JP-A-2008-77958).

Since this film-forming method is capable of patterning without the use of a photolithographic method or a vacuum deposition method using a mask, there is an advantage that the preparation process is simple and at the same time, the amount of the raw material to be used may be reduced.

Generally, for the constituent materials of each layer in an organic EL element, a π-conjugated compound is used.

However, a film-forming ink in the related art has had a problem that the transporting ability of the carrier (holes or electrons) of the resulting film increases too much. It is thought that this problem is caused by a fact that π-conjugated compounds are easily aggregated with one other by the effect of π-π stacking in a solvent or a dispersion medium. Further, if the transporting ability of the carrier of the layer constituting the organic EL element is too high, the transporting balance of the holes and the electrons is deteriorated, leading to reduction of the light-emitting efficiency.

Accordingly, if a film is formed by a liquid droplet discharging method using the film-forming ink, there is no action of a force for prevention of aggregation among the π-conjugated compounds, unlike a spin coating method, and thus, the π-conjugated compounds are easily aggregated with one another and the problems as described above become remarkable.

SUMMARY

An advantage of some aspects of the invention is to provide a film-forming ink, which prevents aggregation among the π-conjugated compounds and is thus capable of forming a film having an excellent film quality in the case where a π-conjugated compound is used as a film-forming material, a film-forming method, a liquid droplet discharging device, a method for preparing a light-emitting element, a light-emitting element prepared by the method for preparing a light-emitting element, and a light-emitting device and an electronic apparatus, having the light-emitting element.

According to a first aspect of the invention, there is provided a film-forming ink including: film-forming materials containing π-conjugated compounds, and a liquid medium which is capable of dissolving or dispersing the film-forming material and containing a compound represented by the following formula (I), wherein the compound is one in which the substituent of at least one of $R^1$ to $R^6$ is a linear or branched alkyl group, and the molecular structure of the one substituent is larger than the molecular structure of another substituent, and thus, the molecular weight of the whole molecule is biased towards the side where the one substituent is present.

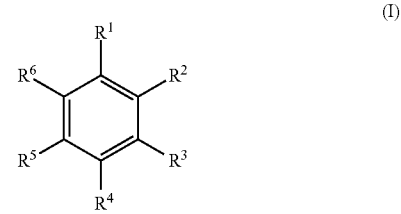

(I)

For this compound, the molecular weight of the whole molecule is biased towards a certain side, that is, the molecular symmetry is low. Particularly, since the one substituent is a linear or branched alkyl group, not a cyclic alkyl group, the compound has reduced flatness of the whole molecule, and as a result, the bulkiness (steric hindrance) increases.

Accordingly, the compound can increase the distance of the π-π stacking between π-conjugated compounds when being interposed between π-conjugated compounds. This makes it possible that a film-forming ink including the compound as a solvent or a dispersion medium can prevent aggregation among π-conjugated compounds even when applied onto the substrate by a liquid droplet discharging method. As a result, the transporting ability of the carrier (holes or electrons) of the resulting film can be suitably inhibited.

For the film-forming ink of the aspect of the invention, in the formula (I), it is preferable that $R^1$ be a linear or branched alkyl group having 3 to 10 carbon atoms, $R^2$, $R^3$, $R^5$, and $R^6$ be each independently, hydrogen or an alkyl group having one carbon atom, and $R^4$ be hydrogen or a linear or branched alkyl group having 1 to 5 carbon atoms.

Since the compound has a number of carbon atoms in the alkyl group, the alkyl group can be interposed between π-conjugated compounds and the distance of the π-π stacking of π-conjugated compound can increase. By this, a film-forming ink including the compound as a solvent or a dispersion medium can clearly prevent the aggregation among π-conjugated compounds when applied onto the substrate by a liquid droplet discharging method. As a result, the transporting ability of the carrier (holes or electrons) of the resulting film can be further suitably inhibited.

Furthermore, since the compound has a number of carbon atoms in $R^1$ while suppressing the number of carbon atoms in $R^2$ to $R^6$, the viscosity can be suppressed even with a number of carbon atoms in the alkyl group. For this reason, the film-forming ink of the aspect of the invention is capable of forming a film with high precision.

For the film-forming ink of the aspect of the invention, in the formula (I), it is preferable that $R^1$ be a linear alkyl group having 6 to 10 carbon atoms and $R^4$ be hydrogen or an alkyl group having one carbon atom.

Thus, the viscosity can be effectively inhibited even with a number of carbon atoms in the alkyl group.

For the film-forming ink of the aspect of the invention, in the formula (I), it is preferable that $R^1$ and $R^4$ be each independently a linear alkyl group having 3 to 5 carbon atoms.

Thus, the viscosity can be effectively inhibited even with a number of carbon atoms in the alkyl group.

For the film-forming ink of the aspect of the invention, in the formula (I), it is preferable that each of at least two of $R^2$, $R^3$, $R^5$, and $R^6$ be hydrogen.

Thus, the number of the alkyl groups can be suppressed, and as a result, an excellent property of removing the solvent or the dispersion medium can be obtained.

For the film-forming ink of the aspect of the invention, in the formula (I), it is preferable that $R^1$ be a linear or branched alkyl group having 1 to 4 carbon atoms, $R^2$, $R^3$, and $R^4$ be each independently hydrogen or a linear or branched alkyl group having 1 to 4 carbon atoms, at least one of $R^2$ and $R^3$ be a linear or branched alkyl group having 1 to 4 carbon atoms, and each of $R^5$ and $R^6$ be hydrogen.

Since the compound has low molecular symmetry, the movement of molecules in the film-forming ink is highly anisotropic. Therefore, when interposed between π-conjugated compounds, the aromatic ring (benzene ring) of the compound is likely to be non-parallel to the aromatic ring of π-conjugated compounds included in the film-forming material when being interposed between π-conjugated compounds, and the distance of the π-π stacking of the π-conjugated compound can be further increased. Thus, a film-forming ink including the compound as a solvent or a dispersion medium can clearly prevent the aggregation among π-conjugated compounds even when applied on a substrate by a liquid droplet discharging method. As a result, the transporting ability of the carrier (holes or electrons) of the resulting film can be further suitably inhibited.

Since the compound has a relatively suppressed number of carbon atoms in $R^1$ to $R^6$, the viscosity can be suppressed even with plural alkyl groups (2- to 4-substitution). Therefore, the film-forming ink of the aspect of the invention can form a film with high precision.

For the film-forming ink of the aspect of the invention, in the formula (I), it is preferable that $R^1$ and $R^2$ be each independently a linear or branched alkyl group having 3 or 4 carbon atoms, and each of $R^3$ and $R^4$ be hydrogen.

Therefore, in the case where the compound is a 2-substituted alkylbenzene, the asymmetry of the compound can be increased. Further, by suppressing the number of the alkyl groups, an excellent property of removing the solvent or the dispersion medium can be obtained.

For the film-forming ink of the aspect of the invention, in the formula (I), it is preferable that $R^1$, $R^2$, and $R^4$ be each independently an alkyl group having 1 or 2 carbon atoms, and each $R^3$ be hydrogen.

Therefore, in the case where the compound is 3-substituted alkylbenzene, the asymmetry of the compound can be increased.

For the film-forming ink of the aspect of the invention, in the formula (I), it is preferable that $R^1$, $R^2$, $R^3$, and $R^4$ be each independently an alkyl group having 1 or 2 carbon atoms.

Thus, by suppressing the number of the alkyl groups, an excellent property of removing the solvent or the dispersion medium can be obtained.

Therefore, in the case where the compound is 4-substituted alkylbenzene, the asymmetry of the compound can be increased. Further, by suppressing the number of the alkyl groups, reduction of the electrical characteristics for the film can be inhibited even though the compound remains in the film.

With the film-forming ink of the aspect of the invention, it is preferable that the film-forming material be a material constituting an organic layer of an organic electroluminescence element, or a precursor thereof.

Generally, a π-conjugated compound is used as a constituent material of the organic layer of an organic EL element. Accordingly, by using the film-forming ink of the aspect of the invention, the transporting ability of the carrier of the organic layer of an organic EL element can be suitably inhibited. Thus, excellent light-emitting efficiency of the organic EL element can be obtained.

The film-forming ink of the aspect of the invention is preferably used to form a film mainly constituted with the film-forming material, by applying it on a substrate, and removing the liquid medium.

Thus, a film for film formation or a precursor film thereof can be formed.

The film-forming ink of the aspect of the invention is preferably used for film formation by a liquid droplet discharging method.

Therefore, a film-forming ink can be applied at a desired position and in a desired region, even with fine areas. Further, the liquid droplet discharging method is advantageous in that a film-forming process is simple and the amount of a raw material (film-forming material) to be used may be small, as compared with a gas-phase film-forming method.

Furthermore, in the liquid droplet discharging method, in the case where a π-conjugated compound is used as a film-forming material, aggregation easily occurs by π-π stacking between π-conjugated compounds, and accordingly, the effect obtained by the application of the invention becomes remarkable.

According to a second aspect of the invention, there is provided a film-forming method including: applying the above-described film-forming ink onto a substrate, and removing the aqueous medium from the film-forming ink to form a film.

Therefore, in the case where a π-conjugated compound is used as a film-forming material, aggregation among π-conjugated compounds can be prevented to form a film having an excellent film quality.

According to a third aspect of the invention, there is provided a liquid droplet discharging device including a liquid droplet discharging head that discharges the above-described film-forming ink.

Therefore, a film-forming ink can be applied at a desired position and in a desired region, even with fine areas. Further, the liquid droplet discharging method is advantageous in that a film-forming process is simple and the amount of a raw material (film-forming material) to be used may be small, as compared with a gas-phase film-forming method.

Furthermore, in the liquid droplet discharging method, in the case where a π-conjugated compound is used as a film-forming material, aggregation easily occurs by π-π stacking between π-conjugated compounds, and accordingly, the effect obtained by application of the invention becomes remarkable.

According to a fourth aspect of the invention, there is provided a method for preparing a light-emitting element including: applying the above-described film-forming ink onto a substrate, and removing the liquid medium from the film-forming ink to form a film.

Thus, by preventing aggregation among the π-conjugated compounds, an organic layer (a hole transporting layer, a light-emitting layer, and the like) having an excellent film quality can be formed.

According to a fifth aspect of the invention, there is provided a light-emitting element prepared using the above-described method for preparing the above-described light-emitting element.

Thus, a light-emitting element which is inexpensive and has excellent light-emitting efficiency can be provided.

According to a sixth aspect of the invention, there is provided a light-emitting device including the above-described light-emitting element.

Thus, a light-emitting device which is inexpensive and has excellent light-emitting efficiency can be provided.

According to a seventh aspect of the invention, there is provided an electronic apparatus including the above-described light-emitting device.

Thus, an electronic apparatus which is inexpensive and has excellent reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinbelow, a film-forming ink, a film-forming method, a liquid droplet discharging device, a method for preparing a light-emitting element, a light-emitting element, a light-emitting device, and an electronic apparatus of the invention will be described, based on suitable embodiments shown in the appended figures.

Light-Emitting Element

Figure 1:
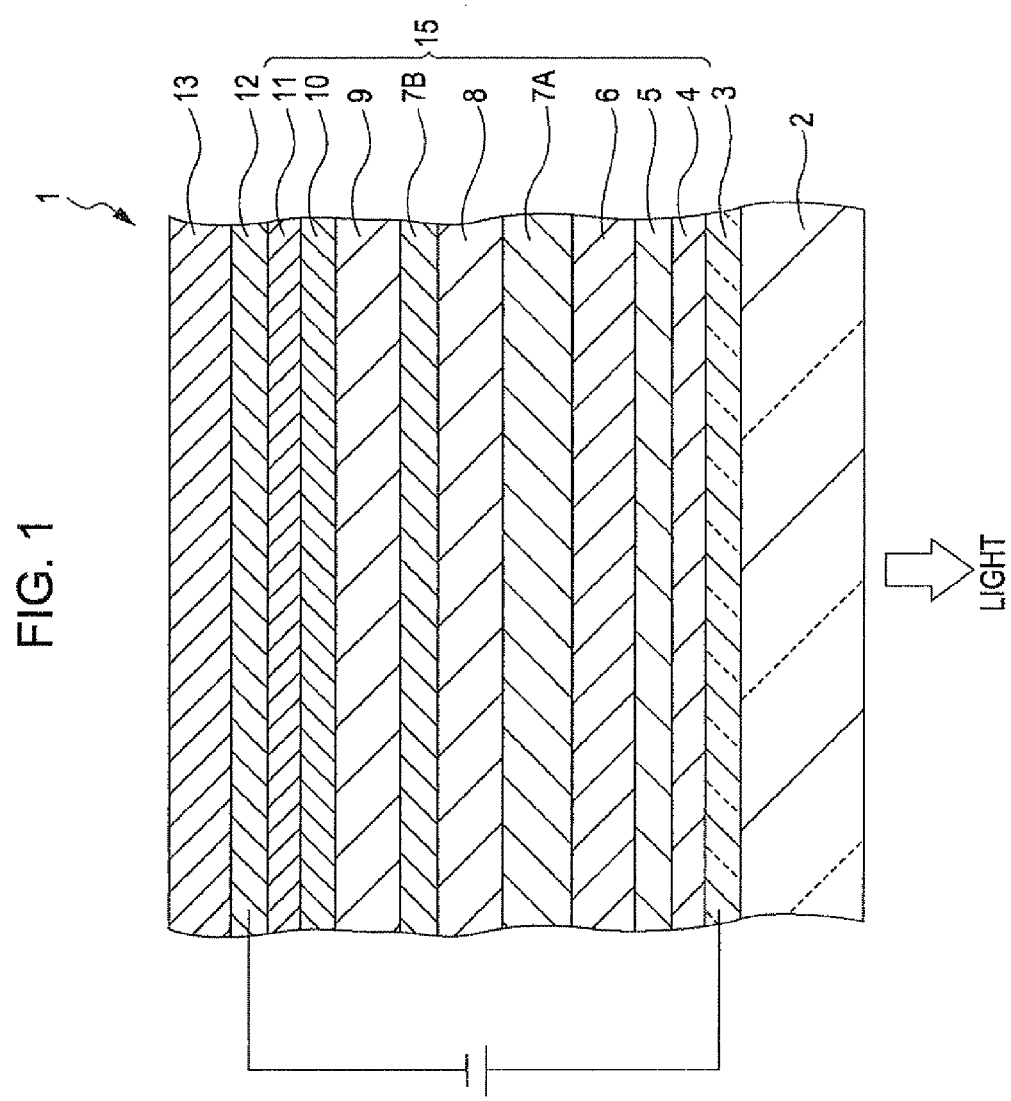
FIG. 1 is a view schematically showing the vertical cross-section of a light-emitting element of an aspect of the invention.

FIG. 1 is a view schematically showing the vertical cross-section of a light-emitting element of an aspect of the invention. Further, hereinafter, the upper side and the lower side are represented by "top" and "bottom", respectively, in FIG. 1, for convenience of description.

The light-emitting element (electroluminescence element) 1 shown in FIG. 1 emits R (red), G (green), and B (blue) light to emit white light.

In the light-emitting element 1, a hole injecting layer 4, a hole transporting layer 5, a red light-emitting layer (first light-emitting layer) 6, a first intermediate layer 7A, a blue light-emitting layer (second light-emitting layer) 8, a second intermediate layer 7B, a green light-emitting layer (third light-emitting layer) 9, an electron transporting layer 10, an electron injecting layer 11, and a negative electrode 12 are laminated in this order between a positive electrode 3 and a negative electrode 12.

In other words, the light-emitting element 1 is configured so that a laminate 15 in which the hole injecting layer 4, the hole transporting layer 5, the red light-emitting layer 6, the first intermediate layer 7A, the blue light-emitting layer 8, the second intermediate layer 7B, the green light-emitting layer 9, the electron transporting layer 10, and the electron injecting layer 11 are laminated in this order is interposed between the two electrodes (between the positive electrode 3 and the negative electrode 12).

Further, at least one layer of the layers (organic layer) constituting the laminate 15 is formed with the film-forming ink and the film-forming method of the invention, as described later.

Further, the whole light-emitting element 1 is provided on a substrate 2 and encapsulated with a sealing member 13.

In the light-emitting element 1, electrons are supplied (injected) from the side of the negative electrode 12 to each light-emitting layer of the red light-emitting layer 6, the blue light-emitting layer 8, and the green light-emitting layer 9, and simultaneously, holes are supplied (injected) from the side of the positive electrode 3. Further, in each light-emitting layer, holes and electrons are recombined and excitons are produced by an energy discharge upon recombination. Further, since energy (fluorescent light or phosphorescent light) is discharged when the excitons are returned to the ground state, the red light-emitting layer 6, the blue light-emitting layer 8, and the green light-emitting layer 9 emit red, blue, and green light, respectively. By this, the light-emitting element 1 emits white light.

The substrate 2 supports the positive electrode 3. Since the light-emitting element 1 of the present embodiment has a structure called a bottom emission type in which light is emitted from the substrate 2, and the substrate 2 and the positive electrode 3 are substantially transparent (colorless transparent, or colored transparent or semitransparent).

Examples of the constituent material of the substrate 2 include resin materials such as polyethylene terephthalate, polyethylene naphthalate, polypropylene, cycloolefin polymer, polyamide, polyethersulfone, polymethylmethacrylate, polycarbonate, and polyallylate, and a glass such as quartz glass and soda glass, and these may be used singly or in combination of two or more kinds thereof.

The average thickness of the substrate 2 is not particularly limited, but is preferably in the order of 0.1 to 30 mm, and more preferably in the order of 0.1 to 10 mm.

Further, in the case of a constitution in which the light-emitting element 1 extracts light from the side opposite to the substrate 2 (top emission type), either a transparent substrate or an opaque substrate can be used as the substrate 2.

Examples of the opaque substrate include substrates made of ceramics such as alumina and the like, metal substrates such as stainless steel whose surface is coated with an oxide film (an insulating film), substrates made of resins, and the like.

Each of the sections constituting the light-emitting element 1 will be sequentially described below.

Positive Electrode

The positive electrode 3 is an electrode that injects holes into the hole transporting layer 5 via a hole injecting layer 4. As a constituent material of the positive electrode 3, a material having a large work function and excellent conductivity is preferably used.

Examples of the constituent material of the positive electrode 3 include oxides such as ITO (Indium Tin Oxide), IZO (Indium Zinc Oxide), $In_2O_3$, $SnO_2$, Sb-containing $SnO_2$, Al-containing ZnO, and the like, metals such as Au, Pt, Ag, and Cu, alloys containing these metals, and the like, and these may be used singly or in combination of two or more kinds thereof.

The average thickness of the positive electrode 3 is not particularly limited, but is preferably in the order of 10 to 200 nm, and more preferably in the order of 50 to 150 nm.

Negative Electrode

On the other hand, the negative electrode 12 is an electrode that injects electrons into the electron transporting layer 10 via the electron injecting layer 11 as described later. As a constituent material of the negative electrode 12, a material having a small work function is preferably used.

Examples of the constituent material of the negative electrode 12 include Li, Mg, Ca, Sr, La, Ce, Er, Eu, Sc, Y, Yb, Ag, Cu, Al, Cs, and Rb, or alloys containing these metals, and the like, and these may be used singly or in combination of two or more kinds thereof (for example, a laminate of plural layers, and the like).

In particular, when an alloy is used as a constituent material of the negative electrode 12, alloys including stable metal elements such as Ag, Al, Cu, and the like, specifically, alloys such as MgAg, AlLi, CuLi, and the like are preferably used. The use of such an alloy as a constituent material of the negative electrode 12 can promote more efficient and stable injection of electrons from the negative electrode 12.

The average thickness of the negative electrode 12 is not particularly limited, but is preferably in the order of 100 to 10000 nm, and more preferably in the order of 200 to 500 nm.

Further, since the light-emitting element 1 of the present embodiment is of a bottom emission type, thus the negative electrode 12 does not need to be optically transparent.

Hole Injecting Layer

The hole injecting layer 4 has a function to improve the efficiency of injection of holes from the positive electrode 3.

Furthermore, in the case where the hole injecting layer 4 is configured to include a π-conjugated compound, it can be formed using the film-forming ink and the film-forming method of the invention, as described in detail later.

The constituent material (hole injecting material) of the hole injecting layer 4 is not particularly limited, but examples thereof include poly(3,4-ethylenedioxythiophene/styrenesulfonic acid) (PEDOT/PSS), PEDOT/PSS/Nafion (registered trademark), polythiophene, and a derivative thereof, polyaniline and a derivative thereof, polypyrrole and a derivative thereof, N,N,N',N'-tetraphenyl-p-diaminobenzene and a derivative thereof, and the like, and these may be used singly or in combination of two or more kinds thereof.

The average thickness of the hole injecting layer 4 is not particularly limited, but is preferably in the order of 5 to 150 nm, and more preferably in the order of 10 to 100 nm.

Hole Transporting Layer

The hole transporting layer 5 has a function to transport the injected holes from the positive electrode 3 to the red light-emitting layer 6 via the hole injecting layer 4.

Furthermore, in the case where the hole transporting layer 5 is configured to include a π-conjugated compound, it can be formed using the film-forming ink and the film-forming method of the invention, as described in detail later.

As a constituent material of the hole transporting layer 5, various p-type high molecular weight materials or various p-type low molecular weight materials may be used singly or in combination of two or more kinds thereof.

Examples of the p-type high molecular weight material (organic polymer) include those having an arylamine skeleton such as polyarylamines including poly(2,7-(9,9-di-n-octylfluorene)-(1,4-phenylene-((4-sec-butylphenyl)imino)-1,4-phenylene (TFB), and the like, those having a fluorene skeleton such as a fluorene bithiophene copolymer, those having both of an arylamine skeleton and a fluorene skeleton, such as a fluorene arylamine copolymer, poly(N-vinylcarbazole), polyvinylpyrene, polyvinylanthracene, polythiophene, polyalkylthiophene, polyhexylthiophene, poly(p-phenylenevinylene), polythinylene vinylene, a pyreneformaldehyde resin, an ethyl carbazole formaldehyde resin, or derivatives thereof, and the like.

These p-type high molecular weight materials may also be used in a mixture with other compounds. As an example, a mixture including a polythiophene such as poly(3,4-ethylenedioxythiophene/styrenesulfonic acid) (PEDOT/PSS), and the like may be mentioned.

Examples of the p-type low molecular weight material include arylcycloalkane-based compounds such as 1,1-bis(4-di-para-triaminophenyl)cyclohexane and 1,1'-bis(4-di-para-tolylaminophenyl)-4-phenyl-cyclohexane, arylamine-based compounds such as 4,4',4''-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), and N,N'-bis(1-naphthyl)-N,N'-diphenyl-1,1'-biphenyl-4,4'-diamine (α-NPD), and TPTE, phenylenediamine-based compounds such as N,N,N',N'-tetraphenyl-para-phenylenediamine, N,N,N',N'-tetra(para-tolyl)-para-phenylenediamine, and N,N,N',N'-tetra(meta-tolyl)-meta-phenylenediamine (PDA), carbazole-based compounds such as carbazole, N-isopropylcarbazole, and N-phenylcarbazole, stilbene-based compounds such as stilbene and 4-di-para-tolylaminostilbene, oxazole-based compounds such as $O_xZ$, triphenylmethane-based compounds such as triphenylmethane and m-MTDATA, pyrazoline-based compounds such as 1-phenyl-3-(para-dimethylaminophenyl)pyrazoline, benzine (cyclohexadiene)-based compounds, triazole-based compounds such as triazole, imidazole-based compounds such as imidazole, oxadiazole-based compounds such as 1,3,4-oxadiazole and 2,5-di(4-dimethylaminophenyl)-1,3,4-oxadiazole, anthracene-based compounds such as anthracene and 9-(4-diethylaminostyryl)anthracene, fluorenone-based compounds such as fluorenone, 2,4,7-trinitro-9-fluorenone, and 2,7-bis(2-hydroxy-3-(2-chlorophenylcarbamoyl)-1-naphthylazo)fluorenone, aniline-based compounds such as polyaniline, silane-based compounds, pyrrole-based compounds such as 1,4-dithioketo-3,6-diphenyl-pyrrolo-[3,4-c]pyrrolopyrrole, fluorene-based compounds such as fluorene, porphyrin-based compounds such as porphyrin and metal tetraphenylporphyrin, quinacridone-based compounds such as quinacridone, metallic or non-metallic phthalocyanine-based compounds such as phthalocyanine, copper phthalocyanine, tetra(t-butyl)copper phthalocyanine, and iron phthalocyanine, metallic or non-metallic naphthalocyanine-based compounds such as copper naphthalocyanine, vanadyl naphthalocyanine, and monochlorogallium naphthalocyanine, and benzidine-based compounds such as N,N'-di(naphthalene-1-yl)-N,N'-diphenyl-benzidine and N,N,N',N'-tetraphenylbenzidine, and the like.

The average thickness of the hole transporting layer 5 is not particularly limited, but is preferably in the order of 10 to 150 nm, and more preferably in the order of 10 to 100 nm.

Further, this hole transporting layer 5 may be omitted.

Red Light-Emitting Layer

The red light-emitting layer (first light-emitting layer) 6 is configured to include a red light-emitting material that emits red (a first color) light.

Furthermore, in the case where the red light-emitting layer 6 is configured to include a π-conjugated compound, it can be formed using the film-forming ink and the film-forming method of the invention, as described in detail later.

The red light-emitting material is not particularly limited, but various red fluorescent materials or red phosphorescent materials may be used singly or in combination of two or more kinds thereof.

The red fluorescent material is not particularly limited as long as it generates red fluorescent light, but examples thereof include perylene derivatives, europium complexes, benzopyrane derivatives, rhodamine derivatives, benzothioxanthene derivatives, porphyrin derivatives, Nile red, 2-(1,1-dimethylethyl)-6-(2-(2,3,6,7-tetrahydro-1,1,7,7-tetramethyl-1H,5H-benzo[ij]quinolizine-9-yl)ethenyl]-4H-pyran-4-ylidene}propanedinitrile (DCJTB), 4-(dicyanomethylene)-2-methyl-6-(p-dimethylaminostyryl)-4H-pyran (DCM), poly[2-methoxy-5-(2-ethylhexyloxy)-1,4-(1-cyanovinylenephenylene)], poly[{9,9-dihexyl-2,7-bis(1-cyanovinylene)fluorenylene}ortho-co-{2,5-bis(N,N'-diphenylamino)-1,4-phenylene}], poly[{2-methoxy-5-(2-ethylhexyloxy)-1,4-(1-cyanovinylenephenylene)}-co{2,5-bis(N,N'-diphenylamino)-1,4-phenylene}], and the like.

The red phosphorescent material is not particularly limited as long as it generates red phosphorescent light, but examples thereof include complexes of metals such as iridium, ruthenium, platinum, osmium, rhenium, palladium, and the like, those with a phenylpyridine, bipyridyl, and porphyrin skeleton, or the like in at least one of the ligands thereof, and the like. Specific examples include tris(1-phenylisoquinoline)iridium, bis[2-(2'-benzo[4,5-α]thienyl)pyridinate-N,$C^{3'}$]iridium(acetylacetonate) (btp2Ir(acac)), 2,3,7,8,12,13,17,18-octaethyl-12H,23H-porphyrin-platinum (II), bis[2-(2'-benzo[4,5-α]thienyl)pyridinate-N,$C^{3'}$]iridium and bis(2-phenylpyridine)iridium(acetylacetonate).

Furthermore, the red light-emitting layer 6 may include, in addition to the above-described red light-emitting material, a host material to which a red light-emitting material is added as a guest material.

The host material has a function to recombine holes and electrons to produce excitons and simultaneously, transfer the energy of the excitons to the red light-emitting material (Förster or Dexter transfer) to excite the red light-emitting material. In the case of using the host material, for example, the host material can be doped with the red light-emitting material which is a guest material as a dopant, and used.

The host material is not particularly limited as long as it exerts a function as described above for the red light-emitting material used, but in the case where the red light-emitting material includes a red fluorescent material, examples of the host material include acene derivatives (acene-based materials) such as a naphthacene derivative, a naphthalene derivative, and an anthracene derivative, quinolinolate-based metal complexes such as a distyrylarylene derivative, a perylene derivative, a distyrylbenzene derivative, a distyrylamine derivative, a tris(8-quinolinolate)aluminum complex ($Alq_3$), and the like, triamine derivatives such as a tetramer of triphenylamine, and the like, an oxadiazole derivative, a silole derivative, a dicarbazole derivative, an oligothiophene derivative, a benzopyrane derivative, a triazole derivative, a benzoxazole derivative, a benzothiazole derivative, a quinoline derivative, 4,4'-bis(2,2'-diphenylvinyl)biphenyl (DPVBi), and the like. These may be used singly or in combination of two or more kinds thereof.

In the case of using the red light-emitting material (guest material) and the host material as described above, the content (doping amount) of the red light-emitting material in the red light-emitting layer 6 is preferably 0.01 to 10 wt %, and more preferably 0.1 to 5 wt %. By setting the content of the red light-emitting material within these ranges, the light-emitting efficiency can be optimized.

The average thickness of the red light-emitting layer 6 is not particularly limited, but is preferably in the order of 10 to 150 nm, and more preferably in the order of 10 to 100 nm.

First Intermediate Layer

The first intermediate layer 7A is provided so as to be in contact with, as interposed between, the layers of the red light-emitting layer 6 and the blue light-emitting layer 8 as described later. Further, the first intermediate layer 7A is configured to include substantially no material having a light-emitting property, and has a function to adjust the transfer of the carrier (holes and electrons) between the red light-emitting layer (first light-emitting layer) 6 and the blue light-emitting layer (second light-emitting layer) 8. By this function, the red light-emitting layer 6 and the blue light-emitting layer 8 each can emit light efficiently.

Furthermore, in the case where the first intermediate layer 7A is configured to include a π-conjugated compound, it can be formed using the film-forming ink and the film-forming method of the invention, as described in detail later.

The constituent material of the first intermediate layer 7A is not particularly limited as long as it exerts a function to adjust the carrier as described above, but acene-based materials, amine-based materials, or the like are suitably used.

The acene-based material is not particularly limited as long as it has an acene skeleton and exerts the effect as described above, but examples thereof include a naphthalene derivative, an anthracene derivative, a tetracene(naphthacene) derivative, a pentacene derivative, a hexacene derivative, a heptacene derivative, and the like, and these may be used singly or in combination of two or more kinds thereof.

The amine-based material used in the first intermediate layer 7A is not particularly limited as long as it has an amine skeleton and exerts the effect as described above, and for example, materials having an amine skeleton in the hole transporting material as described above can be used, but benzidine-based amine derivatives are preferably used.

Furthermore, the average thickness of the first intermediate layer 7A is not particularly limited, but is preferably 1 to 100 nm, more preferably 3 to 50 nm, and further preferably 5 to 30 nm. By this, while inhibiting the driving voltage, the first intermediate layer 7A can clearly adjust the transfer of the holes and electrons between the red light-emitting layer 6 and the blue light-emitting layer 8.

Further, the first intermediate layer 7A can be omitted.

Blue Light-Emitting Layer

The blue light-emitting layer (second light-emitting layer) 8 is configured to include a blue light-emitting material which emits blue (a second color) light.

Furthermore, in the case where the blue light-emitting layer 8 is configured to include a π-conjugated compound, it can be formed using the film-forming ink and the film-forming method of the invention, as described in detail later.

Examples of the blue light-emitting material include various blue fluorescent materials and blue phosphorescent materials, and these may be used singly or in combination of two or more kinds thereof.

The blue fluorescent material is not particularly limited as long as it generates blue fluorescent light, but examples thereof include distyrylamine derivatives such as a distyryldiamine-based compound and the like, fluoranthene derivatives, pyrene derivatives, perylene and perylene derivatives, anthracene derivatives, benzoxazole derivatives, benzothiazole derivatives, benzoimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[9,9-dioctylfluoren-2,7-diyl)-co-(2,5-dimethoxybenzen-1,4-diyl)], poly[(9,9-dihexyloxyfluoren-2,7-diyl)-ortho-co-[2-methoxy-5-{2-ethoxyhexyloxy}phenylen-1,4-diyl]], poly[(9,9-dioctylfluoren-2,7-diyl)-co-(ethynylbenzene)], and the like.

The blue phosphorescent material is not particularly limited as long as it generates blue phosphorescent light, but examples thereof include complexes of iridium, ruthenium, platinum, osmium, rhenium, palladium, and other metals. Specific examples include bis(4,6-difluorophenylpyridinate-N,$C^{2'}$)-picolinate-iridium, tris[2-(2,4-difluorophenyl)pyridinate-N,$C^{2'}$]iridium, bis[2-(3,5-trifluoromethyl)pyridinate-N,$C^{2'}$]-picolinate-iridium, bis(4,6-difluorophenylpyridinate-N,$C^{2'}$)iridium(acetylacetonate), and the like.

Furthermore, the blue light-emitting layer 8 may include, in addition to the above-described blue light-emitting material, a host material to which a blue light-emitting material is added as a guest material.

As the host material, the same host materials as described in the above-described red light-emitting layer (first light-emitting layer) 6 can be used.

Second Intermediate Layer

The second intermediate layer 7B is provided so as to be in contact with, as interposed between, the layers of the blue light-emitting layer 8 and the green light-emitting layer 9 as described later. Further, the second intermediate layer 7B is configured to include substantially no material having a light-emitting property, and has a function to adjust the transfer of the carrier (holes and electrons) between the blue light-emitting layer (second light-emitting layer) 8 and the green light-emitting layer (third light-emitting layer) 9. By this function, the energy transfer of the excitons between the blue light-emitting layer 8 and the green light-emitting layer 9 can be suppressed, and thus, the energy transfer from the blue light-emitting layer 8 to the green light-emitting layer 9 is inhibited, and as a result, each of the blue light-emitting layer 8 and the green light-emitting layer 9 can emit light efficiently.

Furthermore, in the case where the second intermediate layer 7B is configured to include a π-conjugated compound, it can be formed using the film-forming ink and the film-forming method of the invention, as described in detail later.

The constituent material of the second intermediate layer 7B is not particularly limited as long as the second intermediate layer 7B includes the same material with or as at least one of the host material of the blue light-emitting layer 8 and the host material of the green light-emitting layer 9, is configured to include substantially no material having a light-emitting property and can exert a function to adjust the carrier as described above, but those including an acene-based material as the same material with or as the host material are used.

As the acene-based material, the same ones as described in the above-described first intermediate layer 7A can be used.

Furthermore, the thickness of the second intermediate layer 7B is not particularly limited, but it is preferably in the order of 2 nm or more and 10 nm or less, and more preferably in the order of 3 nm or more and 7 nm or less. By setting the thickness of the second intermediate layer 7B within these ranges, dissipation of the exciton (holes and electrons) is inhibited or prevented, and thus, the transfer of the excitons can clearly be adjusted.

Further, the second intermediate layer 7B can be omitted.

Green Light-Emitting Layer

The green light-emitting layer (third light-emitting layer) 9 is configured to include a green light-emitting material which emits green (a third color) light.

Furthermore, in the case where the green light-emitting layer 9 is configured to include a π-conjugated compound, it can be formed using the film-forming ink and the film-forming method of the invention, as described in detail later.

The green light-emitting material is not particularly limited, but examples thereof include various green fluorescent materials and green phosphorescent materials, and these may be used singly or in combination of two or more kinds thereof.

The green fluorescent material is not particularly limited as long as it generates green fluorescent light, but examples thereof include coumarin derivatives, quinacridone and its derivatives, 9,10-bis[(9-ethyl-3-carbazoyl)-vinylenyl]-anthracene, poly(9,9-dihexyl-2,7-vinylenefluorenylene), poly[(9,9-dioctylfluorene-2,7-diyl)-co-(1,4-diphenylenevinylene-2-methoxy-5-{2-ethylhexyloxy}benzene)], poly[(9,9-dioctyl-2,7-divinylenefluorenylene)-ortho-co-(2-methoxy-5-(2-ethoxylhexyloxy)-1,4-phenylene)], poly(9,9-dioctylfluorene-co-benzothiadiazole (F8BT), and the like.

The green phosphorescent material is not particularly limited as long as it emits green phosphorescent light, but examples thereof include complexes of metals of iridium, ruthenium, platinum, osmium, rhenium, palladium, and the like, and specifically, include fac-tris(2-phenylpyridine)iridium (Ir(ppy)3), bis(2-phenylpyridinate-N,$C^{2'}$)iridium (acetylacetonate), fac-tris[5-fluoro-2-(5-trifluoromethyl-2-pyridine)phenyl-C,N]iridium, and the like.

Furthermore, the green light-emitting layer 9 may include, in addition to the above-described green light-emitting material, a host material to which a green light-emitting material is added as a guest material.

As the host material, the same host materials as described in the above-described red light-emitting layer (first light-emitting layer) 6 can be used.

Electron Transporting Layer

The electron transporting layer 10 has a function to transport the injected electrons from the negative electrode 12 to the green light-emitting layer 9 via the electron injecting layer 11.

Examples of the constituent material (electron transporting material) of the electron transporting layer 10 include quinoline derivatives of organic metal complexes and the like including 8-quinolinol or a derivative thereof, such as tris(8-quinolinolate)aluminum ($Alq_3$) and the like, as a ligand, oxadiazole derivatives, perylene derivatives, pyridine derivatives, pyrimidine derivatives, quinoxaline derivatives, diphenylquinone derivatives, nitro-substituted fluorene derivatives, and the like. These may be used singly or in combination of two or more kinds thereof.

Furthermore, in the case where the electron transporting layer 10 is configured to include a π-conjugated compound, it can be formed using the film-forming ink and the film-forming method of the invention, as described in detail later.

The average thickness of the electron transporting layer 10 is not particularly limited, but is preferably in the order of 0.5 to 100 nm, and more preferably in the order of 1 to 50 nm.

Further, the electron transporting layer 10 can be omitted.

Electron Injecting Layer

The electron injecting layer 11 has a function to improve the efficiency of electron injection from the negative electrode 12.

Examples of the constituent material (electron injecting material) of the electron injecting layer 11 include various inorganic insulating materials and various inorganic semiconductor materials.

Examples of the inorganic insulating material include alkali metal chalcogenides (oxides, sulfates, selenides, and tellurides), alkaline earth metal chalcogenides, alkali metal halides, alkaline earth metal halides, and the like, and these may be used singly or in combination of two or more kinds thereof. When constituted mainly with any of these materials, the electron injecting property can be further improved. In particular, alkali metal compounds (alkali metal chalcogenides, alkali metal halides, and the like) have a very small work function and thus, when constituting the electron injecting layer 11, provide the resultant light-emitting element 1 with a high brightness.

Examples of the alkali metal chalcogenides include $Li_2O$, LiO, $Na_2S$, $Na_2Se$, NaO, and the like.

Examples of the alkaline earth metal chalcogenides include CaO, BaO, SrO, BeO, BaS, MgO, CaSe, and the like.

Examples of the alkali metal halides include CsF, LiF, NaF, KF, LiCl, KCl, NaCl, and the like.

Examples of the alkaline metal halides include $CaF_2$, $BaF_2$, $SrF_2$, $MgF_2$, $BeF_2$, and the like.

Furthermore, examples of the inorganic semiconductor material include oxides, nitrides, oxide-nitrides, and the like that contain at least one element of Li, Na, Ba, Ca, Sr, Yb, Al, Ga, In, Cd, Mg, Si, Ta, Sb, and Zn, and these may be used singly or in combination of two or more kinds thereof.

The average thickness of the electron injecting layer 11 is not particularly limited, but is preferably in the order of 0.1 to 1000 nm, more preferably in the order of 0.2 to 100 nm, and further preferably in the order of 0.2 to 50 nm.

Further, the electron injecting layer 11 can be omitted.

Sealing Member

The sealing member 13 is provided to cover the negative electrode 12, and has a function to air-tightly seal the positive electrode 3, the laminate 15, and the negative electrode 12 and block oxygen or moisture. By providing the sealing member 13, there are obtained effects of improvement of reliability of the light-emitting element 1, prevention of alteration/deterioration (improvement of durability), and the like.

Examples of the constituent material of the sealing member 13 include Al, Au, Cr, Nb, Ta, Ti, or alloys including these, silicon oxide, various resin materials, and the like. Further, in the case where a material having conductivity is used as a constituent material of the sealing member 13, an insulating film is preferably provided between the sealing member 13 and the negative electrode 12 to avoid short circuit, if required.

Furthermore, the sealing member 13 has a plate shape and faces the substrate 2, and a gap therebetween may be sealed with, for example, a seal such as a thermosetting resin and the like.

Method for Preparing Light-Emitting Element

Next, as for the film-forming ink and the film-forming method of the invention, an example where it is applied to preparation of the above-described light-emitting element 1 will be described. Further, a case where a hole transporting layer 5 is formed using the film-forming ink and the film-forming method of the invention will be described below.

The light-emitting element 1 as above can be prepared, for example, as follows.

[1] In the first place, a substrate 2 is prepared and a positive electrode 3 is formed on the substrate 2.

The positive electrode 3 can be formed using, for example, a chemical vapor deposition (CVD) method such as plasma CVD and thermal CVD, a dry plating method such as vacuum deposition and the like, a wet plating method such as electrolytic plating and the like, a spraying method, a sol-gel method, a MOD method, lamination of metal films, and the like.

[2] Next, a hole injecting layer 4 is formed on the positive electrode 3.

The hole injecting layer 4 can be formed using, for example, a gas-phase process using a CVD method, or a dry plating method such as vacuum deposition, sputtering, and the like.

The hole injecting layer 4 can be formed by supplying a material (ink) for forming a hole injecting layer, which is formed by dissolving the hole injecting material in a solvent or dispersing the hole injecting material in a dispersion medium, to a positive electrode 3 and then performing drying (removal of the solvent or the dispersion medium).

As a method for supplying the material for forming a hole injecting layer, various coating methods such as, for example, a spin coating method, a roll coating method, an ink jet printing method (liquid droplet discharging method), and the like can also be used. By using any of these coating methods, the hole injecting layer 4 can be relatively easily formed.

Examples of the solvent or dispersion medium used for preparation of the material for forming a hole injecting layer include various inorganic solvents, various organic solvents, or a mixed solvent including these, and the like.

Further, drying can be carried out by, for example, leaving to stand under atmospheric pressure or a reduced pressure, heating treatment, spraying of an inert gas, or the like.

Furthermore, prior to the present step, the positive electrode 3 preferably has its upper surface treated with oxygen plasma. For example, this can impart hydrophilicity on the upper surface of the positive electrode 3, remove (wash) off any organic matter from the upper surface of the positive electrode 3, or adjust the work function of the positive electrode 3 around the upper surface.

Here, the oxygen plasma treatment preferably has conditions as follows: for example, a plasma power of in the order of 100 to 800 W, an oxygen gas flow rate of in the order of 50 to 100 mL/min, a transporting speed of a member to be treated (positive electrode 3) of in the order of 0.5 to 10 mm/sec, and a temperature of a support that supports the member to be treated of in the order of 70 to 90° C.

[3] Next, a hole transporting layer 5 is formed on the hole injecting layer 4.

The hole transporting layer 5 is formed by supplying a material for forming a hole transporting layer (the film-forming ink of the aspect of the invention), which is formed by dissolving the hole transporting material in a solvent or dispersing the hole transporting material in a dispersion medium, to a hole injecting layer 4 and then performing drying (removal of the solvent or the dispersion medium).

In particular, as a method for supplying the material for forming a hole injecting layer (film-forming ink), for example, an ink jet method (liquid droplet discharging method) by a liquid droplet discharging device as described later is used.

Liquid Droplet Discharging Device

Here, the liquid droplet discharging device used for film formation of the hole transporting layer 5 will be described.

Figure 2:
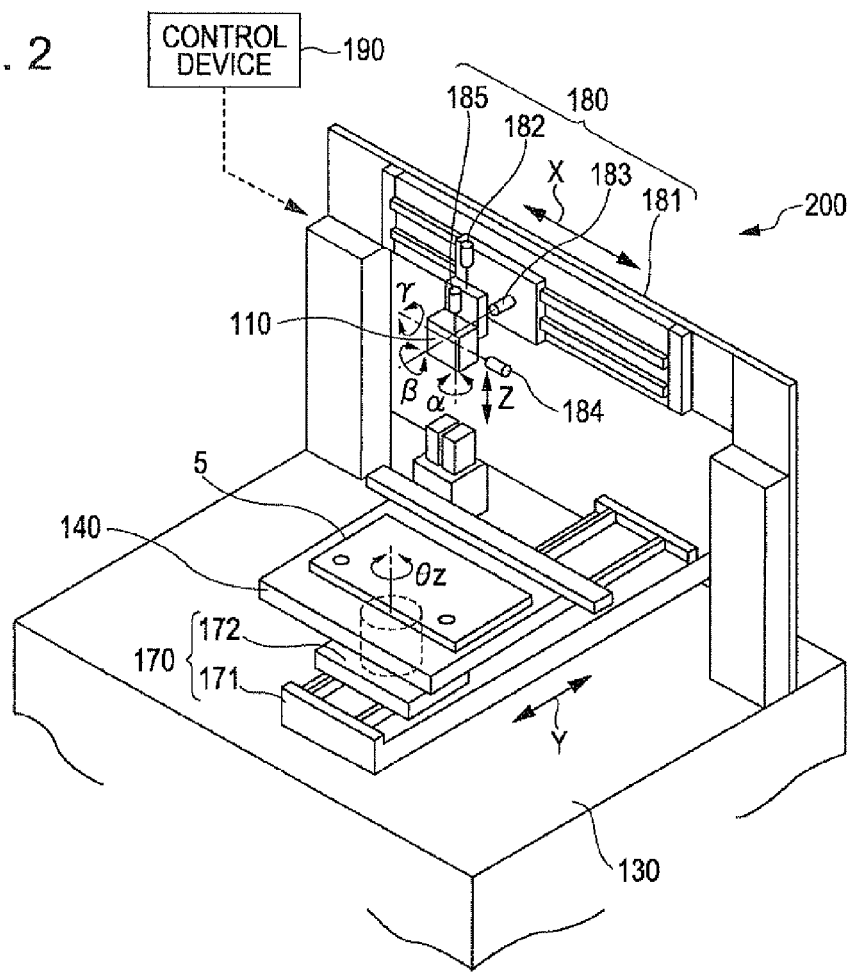
FIG. 2 is a perspective view showing the schematic constitution of a liquid droplet discharging device of an aspect of the invention.
Figure 3:
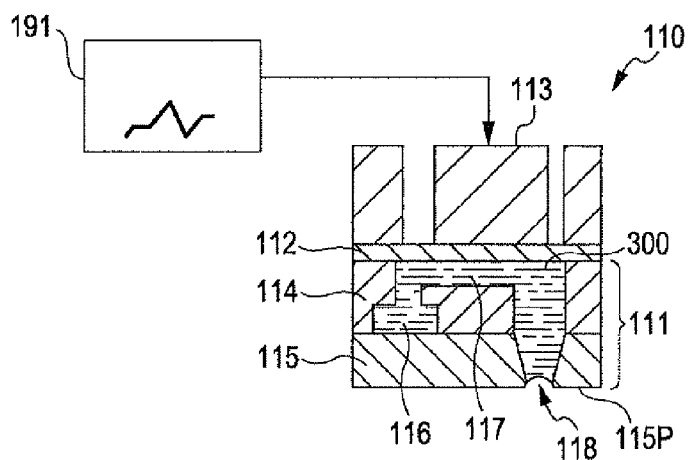
FIG. 3 is a diagram showing the schematic constitution of a liquid droplet discharging head included in the liquid droplet discharging device in FIG. 2.

FIG. 2 is a perspective view showing an example of suitable embodiments of a liquid droplet discharging device (ink jet device), and FIG. 3 is a diagram for illustrating the schematic constitution of a liquid droplet discharging head (ink jet device) included in the liquid droplet discharging device in FIG. 2.

As shown in FIG. 2, the liquid droplet discharging device 200 includes a liquid droplet discharging head (ink jet head, hereinafter also simply referred to a head) 110, a base 130, a table 140, an ink storage section (not shown), a table positioning unit 170, a head positioning unit 180, and a control device 190.

The base 130 is a support that supports each constituent member of the liquid droplet discharging device 200, such as the table 140, the table positioning unit 170, the head positioning unit 180, and the like.

The table 140 is installed on the base 130 via the table positioning unit 170. Further, a substrate S (a laminate including the substrate 20, the positive electrode 3, and the hole injecting layer 4 in the present embodiment) are installed on the table 140.

Furthermore, a rubber heater (not shown) is disposed on the back side of the table 140. The substrate S placed on the table 140 is configured to heat the entire upper surface to a predetermined temperature with a rubber heater.

The table positioning unit 170 includes a first movement unit 171 and a motor 172. The table positioning unit 170 positions the table 140 in the base 130, and thus, positions the substrate S in the base 130.

The first movement unit 171 includes two rails disposed substantially parallel to the Y direction, and a support base moving on the rails. The support base of the first movement unit 171 supports the table 140 via the motor 172. Further, when the support base moves over the rail, the table 140 that places the substrate S moves and is positioned in the Y direction.

The motor 172 supports the table 140, and swings and positions the table 140 in the θz direction.

The head positioning unit 180 includes a second movement unit 181, a linear motor 182, and motors 183, 184, and 185. The head positioning unit 180 positions the head 110.

The second movement unit 181 includes two supporting pillars that are erected from the base 130, a rail stand that is provided interposed between and supported by the supporting pillars and includes the two rails, and a supporting member (not shown) that supports the head 110 movable along the rail. Further, as the supporting member moves along the rail, the head 110 moves and is positioned in the X direction.

The linear motor 182 is provided in the vicinity of the supporting member, and can allow the head 110 to move and be positioned in the Z direction.

The motors 183, 184, and 185 swing and position the head 110 in the α, β, and γ directions, respectively.

By the table positioning unit 170 and the head positioning unit 180 as above, the liquid droplet discharging device 200 is configured to precisely control the relative position and orientation between the ink discharging surface 115P of the head 110 and the substrate S on the table 140.

As shown in FIG. 3, the head 110 discharges a film-forming ink 300 by an ink jet system (liquid droplet discharging System) from a nozzle (protrusion) 118. In the present embodiment, the head 110 utilizes a piezoelectric system in which a piezoelectric element 113 as a piezoelectric element is used to discharge ink. Since the piezoelectric system does not apply heat to the film-forming ink 300, it is advantageous, for example, in that the composition of the materials is not affected.

The head 110 includes a head main body 111, a vibration plate 112, and the piezoelectric element 113.

The head main body 111 includes a main body 114, and a nozzle plate 115 on the bottom surface thereof. Further, by interposing the main body 114 between the plate-shaped nozzle plate 115 and the vibration plate 112, a reservoir 116 as a space and plural ink chambers 117 branched from the reservoir 116 are formed.

To the reservoir 116 is supplied the film-forming ink 300 from the ink storage section which is not shown. The reservoir 116 forms a flow path that supplies the film-forming ink 300 to each of the ink chambers 117.

Furthermore, the nozzle plate 115 is equipped on the bottom surface of the main body 114, and constitutes the ink discharging surface 115P. In the nozzle plate 115, plural nozzles 118 for discharging the film-forming ink 300 are opened, which corresponds to the ink chambers 117, respectively. Further, the ink paths are formed towards the nozzles (discharging sections) 118 which correspond to the ink chambers 117, respectively.

The vibration plate 112 is equipped to the top surface of the head main body 111 and constitutes the wall surface of each of the ink chambers 117. The vibration plate 112 is configured to vibrate in response to vibration of the piezoelectric element 113.

The piezoelectric element 113 is provided, which corresponds to each of the ink chambers 117 on the opposite side of the head main body 111 of the vibration plate 112. The piezoelectric element 113 holds a piezoelectric material such as a crystal and the like with a pair of electrodes (not shown). The pair of electrodes are connected to a driving circuit 191.

Furthermore, when an electrical signal is input from the driving circuit 191 to the piezoelectric element 113, the piezoelectric element 113 is expansion-modified or shrinkage-modified. When the piezoelectric element 113 is shrinkage-modified, the pressure of the ink chamber 117 decreases, and thus, the film-forming ink 300 from the reservoir 116 flows into the ink chamber 117. Further, when the piezoelectric element 113 is expansion-modified, the pressure of the ink chamber 117 increases, and thus, the film-forming ink 300 is discharged from the nozzle 118. Further, by changing the applied voltage, the modification amount of the piezoelectric element 113 can be regulated. In addition, by changing the frequency of the applied voltage, the modification speed of the piezoelectric element 113 can be regulated. That is, by regulating the voltage to be applied to the piezoelectric element 113, the discharging condition of the film-forming ink 300 can be regulated.

The control device 190 regulates each of the parts of the liquid droplet discharging device 200. For example, it controls the waveform of the applied voltage generated in the driving circuit 191 to regulate the discharging condition of the film-forming ink 300 or regulate the head positioning unit 180 and the table positioning unit 170 to regulate the position of the film-forming ink 300 to be discharged to the substrate S.

Film-Forming Ink

The film-forming ink 300 of the invention includes a film-forming material, and a liquid medium in which the film-forming material is dissolved or dispersed.

By applying the film-forming ink 300 to the substrate S (in the present embodiment, the hole injecting layer 4) and removing the liquid medium, the film-forming ink is used for formation of a film (in the present embodiment, the hole transporting layer 5) mainly constituted with the film-forming material. Thus, a film for forming a film (in the present embodiment, the hole transporting layer 5) or a precursor film thereof can be formed.

In particular, the film-forming ink 300 is used for film formation using the liquid droplet discharging device 200, as described above, that is, for forming a film by a liquid droplet discharging method. By this, the film-forming ink 300 can be applied at a desired position and in a desired region, even with fine areas. Further, the liquid droplet discharging method is advantageous in that a film-forming process is simple and the amount of a raw material (film-forming material) to be used may be small, as compared with a gas-phase film-forming method.

Furthermore, in the liquid droplet discharging method, in the case where a π-conjugated compound is used as a film-forming material, aggregation easily occurs by π-π stacking between the π-conjugated compounds, and accordingly, the effect obtained by application of the invention becomes remarkable.

Hereinbelow, each of the components of the film-forming ink 300 of the invention will be described in detail.

Film-Forming Material

The film-forming material included in the film-forming ink 300 of the invention is a constituent material of a film for forming a film (in the present embodiment, the hole transporting layer 5), or a precursor thereof.

In the film-forming ink 300, the film-forming material may be dissolved or dispersed in a liquid medium as described later, but in the case where the film-forming material is dispersed in the liquid medium, the average particle diameter of the film-forming material is preferably 20 to 200 nm, and more preferably 5 to 90 nm. By this, excellent dispersion stability of the film-forming material in the film-forming ink 300 can be obtained.

The film-forming material is preferably soluble in a non-water-based solvent. This film-forming material can be dissolved in a liquid medium. For this reason, even when a high molecular weight material is used as a film-forming material, a homogeneous film can be formed.

In the present embodiment, the film-forming material is a material that constitutes the hole transporting layer of an organic electroluminescence element, or a precursor thereof.

In the above-described light-emitting element 1, the hole injecting layer 4 is provided on the positive electrode 3 and the hole transporting layer 5 is provided on the hole injecting layer 4. Further, when forming the hole transporting layer 5, the film-forming ink 300 in which the constituent material of the hole transporting layer 5 or a precursor thereof is dissolved or dispersed in a non-water-based solvent or dispersion medium is applied onto the hole injecting layer 4 formed using a water-based solvent or dispersion medium. In this case, if the film-forming ink 300 of the invention is used so as to form the hole transporting layer 5, the film-forming ink 300 is wet and spread over the hole injecting layer 4.

Further, in the light-emitting element 1, the hole transporting layer 5 can be omitted as described above. Accordingly, in this case, a light-emitting layer (red light-emitting layer 6) is provided on the hole injecting layer 4. Further, in this case, when forming the red light-emitting layer 6, the film-forming ink in which the constituent material of the red light-emitting layer 6 or a precursor thereof is dissolved or dispersed in a non-water-based solvent or dispersion medium is applied onto the hole injecting layer 4.

The content of the film-forming material in the film-forming ink 300 is determined according to the usages of the film-forming ink 300 and is thus not particularly limited. However, for example, it is preferably 0.01 to 20 wt %, and more preferably 0.05 to 15 wt %. If the content of the film-forming material is within the above-described ranges, a specially excellent discharging property (discharging stability) from the film-forming liquid droplet discharging head (ink jet head) can be obtained.

Liquid Medium

The liquid medium included in the film-forming ink 300 of the invention is one in which the above-described film-forming material is dissolved or dispersed, that is, a solvent or dispersion medium. Most of the liquid medium is removed in a film-forming process as described later.

Particularly, the liquid medium may include a compound represented by the following formula (I).

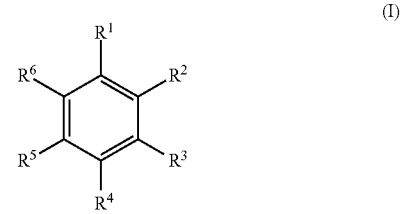

The compound represented by the formula (I) may be one in which the substituent of at least one of $R^1$ to $R^6$ is a linear or branched alkyl group, and the molecular structure of the one substituent is larger than the molecular structure of another substituent. By this, the molecular weight of the whole molecule is biased towards the side where the one substituent is present (that is, the molecular symmetry is low). In particular, since the one substituent is a linear or branched alkyl group, not a cyclic alkyl group, the compound has reduced flatness of the whole molecule, and as a result, the bulkiness (steric hindrance) increases.

Accordingly, the compound can increase the distance of the π-π stacking between π-conjugated compounds when being interposed between π-conjugated compounds. This makes it possible that a film-forming ink including the compound as a solvent or a dispersion medium prevents aggregation among π-conjugated compounds even when applied on the substrate by a liquid droplet discharging method. As a result, the transporting ability of the carrier (holes or electrons) of the resulting film can be suitably inhibited.

In the formula (I), it is preferable that $R^1$ be a linear or branched alkyl group having 3 to 10 carbon atoms, $R^2$, $R^3$, $R^5$, and $R^6$ be each independently, hydrogen or an alkyl group having one carbon atom, and $R^4$ be hydrogen or a linear or branched alkyl group having 1 to 5 carbon atoms.

Since the compound (alkylbenzene) has a number of carbon atoms in the alkyl group, the alkyl group can be interposed between π-conjugated compounds and the distance of the π-π stacking of the π-conjugated compounds which are film-forming materials can increase. By this, a film-forming ink including the compound as a solvent or a dispersion medium can clearly prevent the aggregation among π-conjugated compounds when applied on the substrate by a liquid droplet discharging method. As a result, the transporting ability of the carrier (holes or electrons) of the resulting film can be further suitably inhibited.

Furthermore, since the compound has a number of carbon atoms in $R^1$ while suppressing the number of carbon atoms in $R^2$ to $R^6$, the viscosity can be suppressed even with a number of carbon atoms in the alkyl group. For this reason, the film-forming ink 300 of the invention is capable of forming a film with high precision.

In addition, since the compound contains no polar group, a less adverse effect can be given to the electrical characteristics of the hole transporting layer 5 even when the compound remains in the resulting hole transporting layer 5. Further, the compound has a low attacking property to the film-forming material, and in this regard, deterioration of the characteristics of the resulting hole transporting layer 5 can be prevented.

Furthermore, in the formula (I), when $R^1$ has 6 or more carbon atoms, it is preferable that $R^1$ be a linear alkyl group having 6 to 10 carbon atoms and $R^4$ be hydrogen or an alkyl group having one carbon atom, and it is more preferable that $R^1$ be a linear alkyl group having 8 to 10 carbon atoms and $R^4$ be hydrogen. Thus, the viscosity of the liquid medium and the film-forming ink 300 can be effectively suppressed even with a number of carbon atoms in the alkyl group.

Moreover, in the formula (I), it is preferable that $R^1$ and $R^4$ be each independently a linear alkyl group having 3 to 5 carbon atoms in the case where $R^1$ has 3 or less carbon atoms.

Thus, the viscosity of the liquid medium and film-forming ink 300 can be effectively suppressed even with a number of carbon atoms in the alkyl group.

Furthermore, in the formula (I), it is preferable that at least two of $R^2$, $R^3$, $R^5$, and $R^6$ be hydrogen, and it is more preferable that at least three of $R^2$, $R^3$, $R^5$, and $R^6$ be hydrogen. Thus, the number of the alkyl groups can be suppressed, and as a result, the property of removing the solvent or the dispersion medium of the film-forming ink 300 can be improved.

Furthermore, the compound represented by the formula (I) may be used singly or in combination of two or more kinds thereof.

Furthermore, in the formula (I), it is preferable that $R^1$ be a linear or branched alkyl group having 1 to 4 carbon atoms, $R^2$, $R^3$, and $R^4$ be each independently hydrogen or a linear or branched alkyl group having 1 to 4 carbon atoms, at least one of $R^2$ and $R^3$ be a linear or branched alkyl group having 1 to 4 carbon atoms, and each of $R^5$ and $R^6$ be hydrogen.

Since the compound (alkylbenzene) has low molecular symmetry, the movement of molecules in the film-forming ink is highly anisotropic. Therefore, when interposed between π-conjugated compounds, the aromatic ring (benzene ring) of the compound is likely to be non-parallel to the aromatic ring of π-conjugated compound included in the film-forming material and the distance of the π-π stacking of the π-conjugated compound can be further increased. Thus, a film-forming ink including the compound as a solvent or a dispersion medium can clearly prevent the aggregation among π-conjugated compounds even when applied on a substrate S by a liquid droplet discharging method. As a result, the transporting ability of the carrier (holes or electrons) of the resulting film can be further suitably inhibited.

Furthermore, since the compound has a relatively minimized number of carbon atoms in $R^1$ to $R^6$, the viscosity can be suppressed even with plural alkyl groups (2- to 4-substitution). Therefore, the film-forming ink 300 of the invention can form a film with high precision.

In addition, since the compound has a number of carbon atoms of $R^1$ while suppressing the number of carbon atoms in $R^2$ to $R^6$, the viscosity can be suppressed even with a number of carbon atoms of the alkyl group. Therefore, the film-forming ink 300 of the invention can form a film with high precision.

Furthermore, since the compound contains no polar group, a less adverse effect can be given to the electrical characteristics of the hole transporting layer 5 even when the compound remains in the resulting hole transporting layer 5. Further, the compound has a low attacking property to the film-forming material, and in this regard, deterioration of the characteristics of the resulting hole transporting layer 5 can be prevented.

In addition, the compound represented by the formula (I) may be used singly or in combination of two or more kinds thereof.

Moreover, in the case where the compound represented by the formula (I) is 2-substituted alkylbenzene, in the formula (I), it is preferable that $R^1$ and $R^2$ be each independently a linear or branched alkyl group having 3 or 4 carbon atoms, and $R^3$ and $R^4$ each be hydrogen. That is, it is preferable that the liquid medium included in the film-forming ink 300 include the compound represented by the following formula (1).

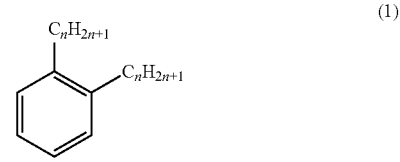

[in the formula (1), n's are each independently 3 or 4, and in the case of two n's in the formula (1), it is preferable that at least one n be 4, and it is more preferable that both n's each be 4].

Thus, in the case where the compound of the formula (I) is 2-substituted alkylbenzene, the asymmetry of the compound can be increased. Further, by suppressing the number of the alkyl groups, the property of removing the solvent or the dispersion medium of the film-forming ink 300 can be improved.

Moreover, in the case where the compound represented by the formula (I) is 3-substituted alkylbenzene, in the formula (I), it is preferable that $R^1$, $R^2$, and $R^4$ be each independently an alkyl group having 1 or 2 carbon atoms, and $R^3$ be hydrogen. That is, it is preferable that the liquid medium included in the film-forming ink 300 includes the compound represented by the following formula (2).

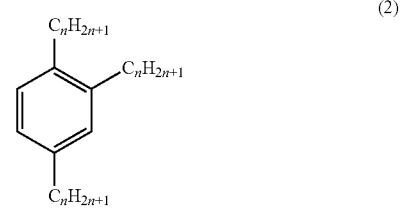

[in the formula (2), n's are each independently 1 or 2, and in the case of three n's in the formula (2), it is preferable that at least one n be 1].

Thus, in the case where the compound of the formula (I) is 3-substituted alkylbenzene, the asymmetry of the compound can be increased.

Moreover, in the case where the compound represented by the formula (I) is 4-substituted alkylbenzene, in the formula (I), it is preferable that $R^1$, $R^2$, R3, and $R^4$ be each independently an alkyl group having 1 or 2 carbon atoms. That is, it is preferable that the liquid medium included in the film-forming ink 300 include the compound represented by the following formula (3).

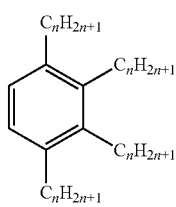

(3)

[in the formula (3), n's are each independently 1 or 2, and preferably, each of four n's in the formula (3) is 1].

Therefore, in the case where the compound in the formula (I) is a 4-substituted alkylbenzene, the asymmetry of the compound can be increased. Further, by suppressing the number of the alkyl groups, reduction of the electrical characteristics for the film can be inhibited even though the compound remains in the film.

Furthermore, since the compound represented by the formula (I) having a higher total number of carbon atoms of all the alkyl groups is more likely to be interposed among π-conjugated compounds included in the film-forming material, thus, the distance of the π-π stacking can increase. However, there is a tendency that the melting point/boiling point increases, and thus, the property of removing a solvent/dispersion medium is reduced.

Examples of the method for increasing the total number of carbon atoms of all the alkyl groups include a method for increasing the substitution number of the alkyl groups and a method for increasing the number of carbon atoms of each alkyl group, and these methods may be used singly or in combination thereof.

The method for increasing the substitution number of the alkyl groups leads to a higher increase in the melting point/boiling point than the method for increasing the number of carbon atoms of each alkyl group. That is, the method for increasing the number of carbon atoms of each alkyl group can suppress the melting point/boiling point to a lower level than the method for increasing the substitution number of the alkyl groups, and thus, a good property of removing a solvent/dispersion medium can be obtained.

Furthermore, it is presumed that as the compound has higher asymmetry (that is, low symmetry), the anisotropy of the molecular movement in the film-forming ink is higher. Therefore, as the anisotropy of the molecular movement is higher, the movement is likely to be non-parallel to the aromatic ring of the π-conjugated compound included in the film-forming material and the distance of the π-π stacking of the π-conjugated compound can be increased.

In addition, the content of the compound represented by the formula (I) in the liquid medium is 50 wt % or more and 100 wt % or less, but is preferably 70 wt % or more and 100 wt % or less.

Moreover, other compounds may be included in the liquid medium, in addition to the compound represented by the formula (I). Examples of the compound included in the liquid medium include benzene (boiling point 80.1° C., melting point 5.5° C.), toluene (boiling point 110.6° C., melting point −93° C.), o-xylene (p-, m-) (boiling point 144° C., melting point −25° C.), trimethylbenzene (boiling point 165° C., melting point −45° C.), tetralin (tetrahydronaphthalene, boiling point 208° C., melting point −35.8° C.), cyclohexylbenzene (boiling point 237.5° C., melting point 5° C.), 1,4-dichlorobenzene (boiling point 174° C., melting point 53.5° C.), 1,2,3-trichlorobenzene (boiling point 221° C., melting point 52.6° C.), tetrahydrofuran (boiling point 66° C., melting point −108.5° C.), diethyl ether (boiling point 35° C., melting point −116° C.), diisopropyl ether (boiling point 69° C., melting point −85.6° C.), ethylene glycol (boiling point 197.3° C., melting point −12.9° C.), ethylene glycol diethyl ether (boiling point 190° C., melting point −44.3° C.), dioxane (boiling point 101.1° C., melting point 11.8° C.), anisole (methoxybenzene, boiling point 154° C., melting point −37° C.), dichloromethane (boiling point 40° C., melting point −96.7° C.), trichloromethane (boiling point 61.2° C., melting point −64° C.), carbon tetrachloride (tetrachloromethane, boiling point 76.7° C., melting point −28.6° C.), pentane (boiling point 36° C., melting point −131° C.), hexane (boiling point 69° C., melting point −95° C.), cyclohexane (boiling point 81° C., melting point 7° C.), acetone (boiling point 56.5° C., melting point −94° C.), 1-methyl-2-pyrrolidinone (NMP, boiling point 204° C., melting point −24° C.), methylethylketone (boiling point 79.6° C., melting point −86° C.), alpha-tetralone (boiling point 257° C., melting point 7° C.), cyclohexanone (boiling point 157° C., melting point −45° C.), ethyl acetate (boiling point 77.1° C., melting point −83.6° C.), butyl acetate (boiling point 126° C., melting point −74° C.), methanol (boiling point 67° C., melting point −97° C.), ethanol (boiling point 78.4° C., melting point −114.3° C.), isopropyl alcohol (boiling point 82.4° C., melting point −89.5° C.), 1-propanol (boiling point 97.15° C., melting point −126.5° C.), acetonitrile (boiling point 82° C., melting point −45° C.), N,N-dimethylformamide (DMF, boiling point 153° C., melting point −61° C.), N,N-dimethylacetamide (DMAc: boiling point 165° C., melting point −20° C.), 1,3-dimethyl-2-imidazolidinone (boiling point 220° C., melting point 8° C.), dimethyl sulfoxide (boiling point 189° C., melting point 18.5° C.), 4-tert-butylanisole (boiling point 222° C., melting point 18° C.), trans-anethole (boiling point 235° C., melting point 20° C.), 1,2-dimethoxybenzene (boiling point 206.7° C., melting point 22.5° C.), 2-methoxybiphenyl (boiling point 274° C., melting point 28° C.), phenyl ether (boiling point 258.3° C., melting point 28° C.), 2-ethoxynaphthalene (boiling point 282° C., melting point 35° C.), benzyl phenyl ether (boiling point 288° C., melting point 39° C.), 2,6-dimethoxytoluene (boiling point 222° C., melting point 39° C.), 2-propoxynaphthalene (boiling point 305° C., melting point 40° C.), 1,2,3-trimethoxybenzene (boiling point 235° C., melting point 45° C.), 1,4-dichlorobenzene (boiling point 174° C., melting point 53.5° C.), and the like, and these may be used singly or in combination of two or more kinds thereof.

Furthermore, a high-boiling point solvent may be included in the liquid medium, and examples of the high-boiling point solvent include aromatic hydrocarbons, isopropyl alcohol (IPA), normal butanol, γ-butyrolactone, N-methylpyrrolidone (NMP), dimethyl formamide (DMF), hexamethyl phosphoramide (HMPA), dimethyl sulfoxide (DMSO), 1,3-dimethyl-2-imidazolidinone (DMI), and derivatives thereof, and glycol ethers such as carbitol acetate, butyl carbitol acetate, and the like, and these may be used singly or in combination of two or more kinds thereof.

The viscosity of the liquid medium at normal temperature (20° C.) (hereinafter sometimes also simply referred to as "viscosity") is not particularly limited, but is preferably 6 cP or less, and more preferably 4 cP or less. Thus, the wetting property of the film-forming ink 300 over the layer formed using the water-based solvent or dispersion medium (in the present embodiment, the hole injecting layer 4) can be effectively enhanced.

Furthermore, the boiling point of the liquid medium at normal pressure is preferably 200° C. or higher. Thus, the volatility of the liquid medium of the film-forming ink 300 is suppressed, and the film-forming ink 300 can be stably discharged using a liquid droplet discharging method.

The content of the liquid medium in the film-forming ink 300 is preferably 80 to 99.99 wt %, and more preferably 85 to 99.95 wt %.

The film-forming ink as described above is used for film formation using an ink jet method (liquid droplet discharging method) as described later. By the ink jet method, relatively simple and clearly fine patterning can be carried out.

Furthermore, in the liquid droplet discharging method, in the case of using a π-conjugated compound as a film-forming material, aggregation among the π-conjugated compounds easily occurs by π-π stacking, and thus, the effect obtained by application of the invention becomes remarkable.

The film-forming ink forms a liquid phase in the process [1] of applying ink as described later.

Furthermore, the viscosity of the film-forming ink is not particularly limited, but is preferably in the order of 1 cP or more and 7 cP or less. By adjusting the viscosity of the film-forming ink within these ranges, the effect of a lower viscosity of the liquid medium as described above becomes remarkable.

The hole transporting layer 5 is formed using the liquid droplet discharging device 200 and the film-forming ink 300, as described above.

Film-Forming Method

Specifically, the method for forming the hole transporting layer 5 (film-forming method) includes [3-1] applying the above-described film-forming ink 300 onto the substrate S (specifically, the hole injecting layer 4) and [3-2] removing the liquid medium from the film-forming ink 300 to form the hole transporting layer 5.

Thus, in the case where a π-conjugated compound is used as a film-forming material, aggregation among the π-conjugated compounds is prevented, and thus, a film having an excellent film quality can be formed.

3-1.

Specifically, a desired amount of the film-forming ink 300 is applied onto the hole injecting layer 4, using the above-described liquid droplet discharging device 200.

In this process [3-1], the temperature and pressure of atmosphere can be determined, respectively, according to the composition of the film-forming ink 300, and they are not particularly limited as long as they allow the film-forming ink 300 to be applied on the substrate S. However, normal temperature and normal pressure are preferable. By this, application of the film-forming ink 300 can be simply carried out.

3-2.

Further, by removing the liquid medium from the film-forming ink 300 formed on the substrate S (in the present embodiment, a laminate including the substrate 20, the positive electrode 3, and the hole injecting layer 4, and specifically, the hole injecting layer 4), a film mainly constituted with the film-forming material (that is, the hole transporting layer 5 or a precursor film thereof) is obtained.

In this process [3-2], the temperature and atmospheric pressure can be determined, respectively, according to the composition of the film-forming ink 300, and they are not particularly limited as long as they allow the liquid medium to be removed from the film-forming ink 300 on the substrate S. However, removal of the liquid medium is preferably carried out under heating/under reduced pressure. By this, the liquid medium can be efficiently removed from the film-forming ink 300.

The heating is not particularly limited, but can be carried out with a hot plate, infrared rays, or the like. Further, the heating may be carried out with a rubber heater provided in the table 140 of the above-described liquid droplet discharging device 200.

The heating temperature is not particularly limited, but is preferably in the order of 60 to 100° C.

Furthermore, the heating time is not particularly limited, but is preferably in the order of 1 minute or more and 30 minutes or less.

The pressure during reduction of the pressure as described above is not particularly limited, but is preferably in the order of $10^{-7}$ Pa or more and 10 Pa or less.

The film formed by the removal of the liquid medium is constituted with a constituent material of the hole transporting layer 5 for film formation, or a precursor thereof.

Furthermore, in the case where the precursor of the constituent material of the hole transporting layer 5 is used as a film-forming material, the film obtained by removing the liquid medium is subject to a predetermined treatment, if required. For example, it is subject to a heating treatment (calcination treatment) under an inert gas atmosphere.

The heating temperature is not particularly limited, but is preferably in the order of 100 to 200° C.

Furthermore, the heating time is not particularly limited, but is preferably in the order of 10 minutes or more and 2 hours or less.

Thus, the hole transporting layer 5 is formed.

[4] Next, a red light-emitting layer 6 is formed on the hole transporting layer 5.

The red light-emitting layer 6 can be formed using, for example, a gas-phase process using a CVD method, or a dry plating method such as vacuum deposition, sputtering, and the like.

Furthermore, the red light-emitting layer 6 can also be formed by supplying a material for forming a red light-emitting layer, which is formed by dissolving the constituent material in a solvent or dispersing the constituent material in a dispersion medium, to the hole transporting layer 5 and then performing drying (removal of the solvent or the dispersion medium).

[5] Next, a first intermediate layer 7A is formed on the red light-emitting layer 6.

The first intermediate layer 7A can be formed using, for example, a gas-phase process using a CVD method, or a dry plating method such as vacuum deposition, sputtering, and the like.

Furthermore, the first intermediate layer 7A can also be formed by supplying a material for forming a first intermediate layer, which is formed by dissolving the constituent material in a solvent or dispersing the constituent material in a dispersion medium, to the red light-emitting layer 6 and then performing drying (removal of the solvent or the dispersion medium).

[6] Next, a blue light-emitting layer 8 is formed on the first intermediate layer 7A.

The blue light-emitting layer 8 can be formed using, for example, a gas-phase process using a CVD method, or a dry plating method such as vacuum deposition, sputtering, and the like.

[7] Next, a second intermediate layer 7B is formed on the blue light-emitting layer 8.

The second intermediate layer 7B is formed by the same method as the method for forming the first intermediate layer 7A as described in the process [5].

[8] Next, a green light-emitting layer 9 is formed on the second intermediate layer 7B.

The green light-emitting layer 9 can be formed using, for example, a gas-phase process using a CVD method, or a dry plating method such as vacuum deposition, sputtering, and the like.

[9] Next, an electron transporting layer 10 is formed on the green light-emitting layer 9.

The electron transporting layer 10 can be formed using, for example, a gas-phase process using a CVD method, or a dry plating method such as vacuum deposition, sputtering, and the like.

Furthermore, the electron transporting layer 10 can also be formed by supplying a material for forming an electron transporting layer, which is formed by dissolving the electron transporting material in a solvent or dispersing the electron transporting material in a dispersion medium, to the green light-emitting layer 9 and then performing drying (removal of the solvent or the dispersion medium).

[10] Next, an electron injecting layer 11 is formed on the electron transporting layer 10.

In the case where an inorganic material is used as a constituent material of the electron injecting layer 11, the electron injecting layer 11 can be formed using, for example, a gas-phase process using a CVD method, or a dry plating method such as vacuum deposition, sputtering, and the like, application and calcination of inorganic fine particle ink, or the like.

[11] Next, a negative electrode 12 is formed on the electron injecting layer 11.

The negative electrode 12 can be formed using, for example, a vacuum deposition method, a sputtering method, bonding of a metal foil, application and calcination of metallic fine particle ink, or the like.

By the processes above, the light-emitting element 1 is obtained.

Finally, a sealing member 13 is formed so as to cover the light-emitting element 1.

Since the method for preparing the light-emitting element 1 as described above includes the processes [3-1] and [3-2], aggregation among π-conjugated compounds, which are film-forming materials, can be prevented. As a result, the transporting ability of the carrier (holes or electrons) of the resulting film can be suitably inhibited. For this reason, the resulting light-emitting element 1 has an arranged transporting balance between holes and electrons (carrier balance) and has excellent light-emitting efficiency. Further, the light-emitting element 1 can be prepared at low cost.

The light-emitting element 1 as described above can be used as, for example, a light source or the like. Further, by arranging plural light-emitting elements 1 in the matrix form, a display device (displays) can be constituted.

Further, the method for driving a display device is not particularly limited, but an active matrix method or a passive matrix method may be used.

Display Device

Next, an example of a display device including the light-emitting device of an aspect of the invention will be described.

Figure 4:
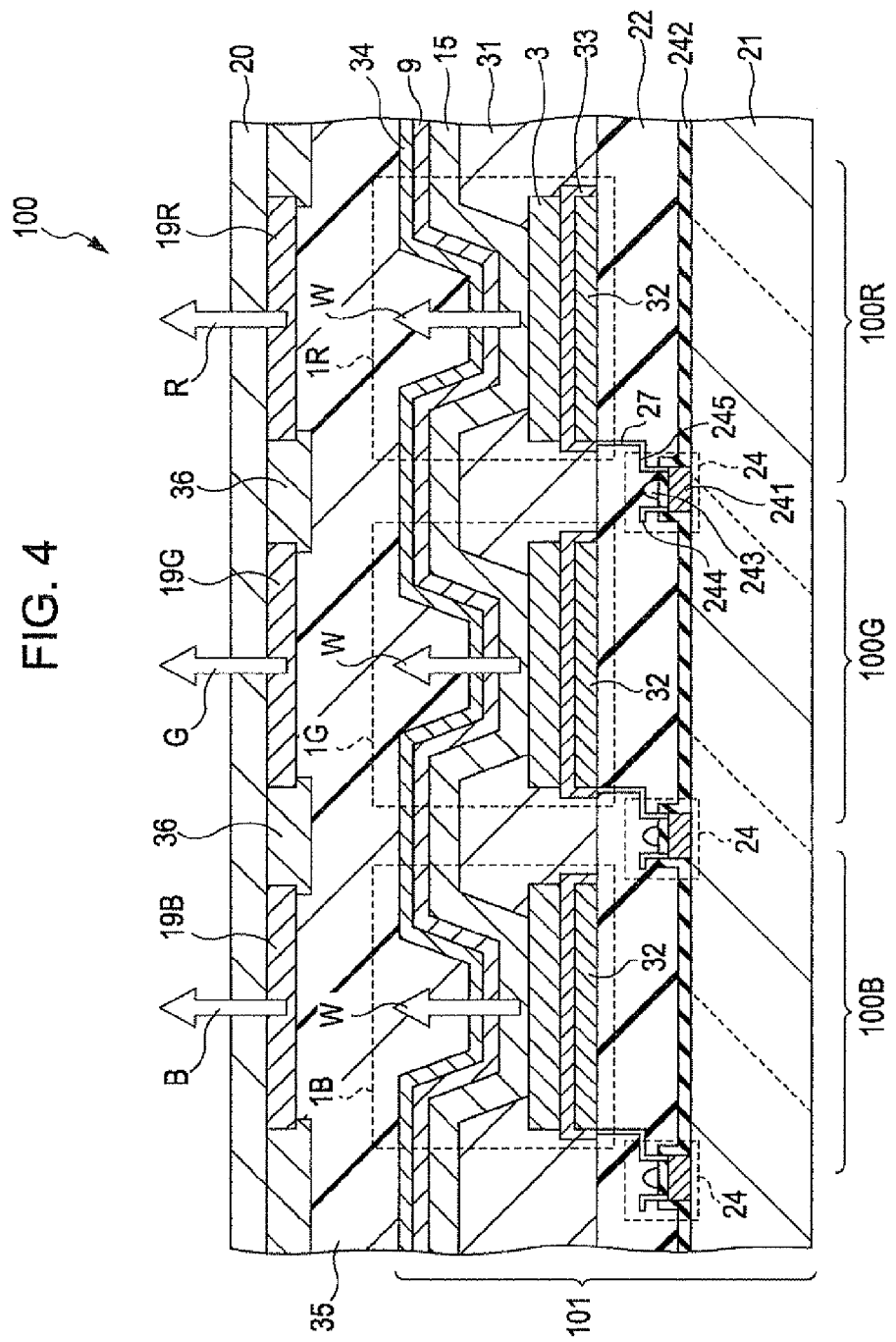
FIG. 4 is a view schematically showing the vertical cross-section of a display device including a light-emitting device according to an embodiment of the invention.

FIG. 4 is a view schematically showing the vertical cross-section of an embodiment of a display device including a light-emitting device of an aspect of the invention.

The display device 100 shown in FIG. 4 includes a substrate 21, plural light-emitting elements 1R, 1G, and 1B, which correspond to subsidiary pixels 100R, 100G, and 100B, respectively, color filters 19R, 19G, and 10B, and plural driving transistors 24 for driving the light-emitting elements 1R, 1G, and 1B, respectively. Here, the display device 100 is a display panel that has a top emission type structure.

Plural driving transistors 24 are provided on the substrate 21, and a flattening layer 22 constituted with an insulating material is provided to cover the driving transistors 24.

Each driving transistor 24 includes a semiconductor layer 241 made of silicon, a gate insulating layer 242 formed on the semiconductor layer 241, and a gate electrode 243, a source electrode 244, and a drain electrode 245, all formed on the gate insulating layer 242.

The light-emitting elements 1R, 1G, and 1B, which each correspond to the driving transistors 24, are provided on the flattening layer.

The light-emitting element 1R includes a reflective film 32, an anti-corrosion film 33, a positive electrode 3, a laminate (organic EL light-emitting section) 15, a negative electrode 12, and a negative electrode cover 34, which are laminated in this order on the flattening layer 22. In the present embodiment, the positive electrode 3 of each light-emitting element 1R, 1G, 1B constitutes a pixel electrode and is electrically connected to the drain electrode 245 of each driving transistor 24 via a conductive line (wiring) 27. Further, the negative electrode 12 is shared by the light-emitting elements 1R, 1G, and 1B.

Moreover, the light-emitting elements 1G and 1B have the same constitution as the light-emitting element 1R. Further, in FIG. 4, the same symbols are attached to the same constitutions as in FIG. 1. In addition, the constitutions (characteristics) of the reflective film 32 may vary among the light-emitting elements 1R, 1G, and 1B, depending on the wavelength of light.

The adjacent light-emitting elements 1R, 1G, and 1B are separated from each other with partitions 31. Further, on the light-emitting elements 1R, 1G, and 1B, an epoxy layer 35 constituted with an epoxy resin is formed so as to cover the light-emitting elements.

Since the light-emitting device 101 includes the light-emitting elements 1R, 1G, and 1B, having the same constitution as the above-described light-emitting element 1, it can be provided with inexpensiveness and excellent light-emitting characteristics (particularly light-emitting efficiency).

The color filters 19R, 19G, and 19B are provided on the epoxy layer 35 so that they correspond to the light-emitting elements 1R, 1G, and 1B, respectively.

The color filter 19R converts white light W that comes from the light-emitting element 1R into red light. Further, the color filter 19G converts white light W that comes from the light-emitting element 1G into green light, and the color filter 19B converts white light W that comes from the light-emitting element 1B into blue light. A combined use of the color filters 19R, 19G, and 19B and the light-emitting elements 1R, 1G, and 1B can display a full-color image.

Furthermore, the adjacent color filters 19R, 19G, and 19B are separated from each other with light-shielding layers 36. This prevents unintended light emission by the subsidiary pixels 100R, 100G, and 100B.

Moreover, a substrate 20 is provided on the color filters 19R, 19G, and 19B, together with the light-shielding layers 36, so as to cover them.

The display device 100 as described above may be used for monochrome display or color display, and color display can be available when appropriate light-emitting materials are chosen, which correspond to the light-emitting elements 1R, 1G, and 1B.

The display device 100 (displays) can be assembled into various electronic apparatuses.

Figure 5:
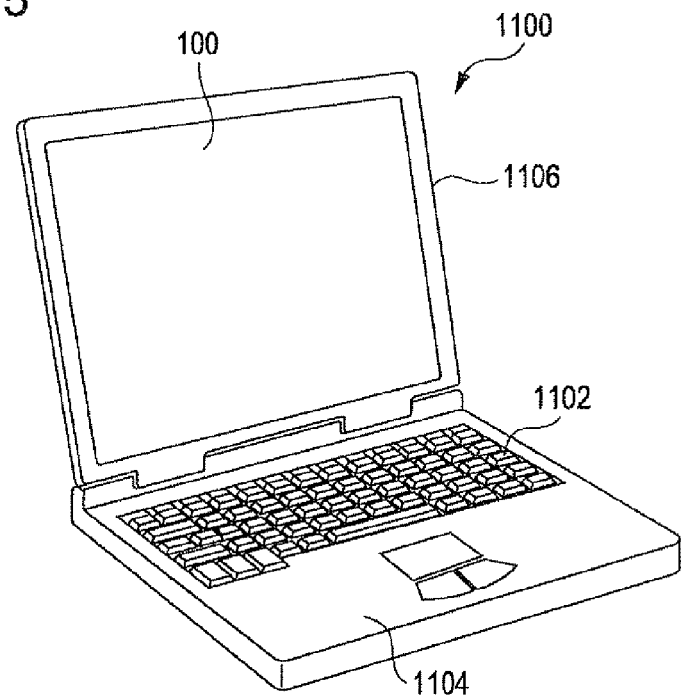
FIG. 5 is a perspective view showing the constitution of a mobile (notebook) personal computer to which an electronic apparatus according to an aspect of the invention is applied.

FIG. 5 is a perspective view showing the constitution of a mobile (notebook) personal computer to which an electronic apparatus according to an aspect of the invention is applied.

In this figure, a personal computer 1100 is constituted with a main body 1104 including a keyboard 1102 and a display unit 1106 including a display section, and the display unit 1106 is hinge-mounted to the main body 1104, and thus supported so as to be capable of rotary movement.

In this personal computer 1100, the display portion including the display unit 1106 is constituted with the display device 100 as described above.

Figure 6:
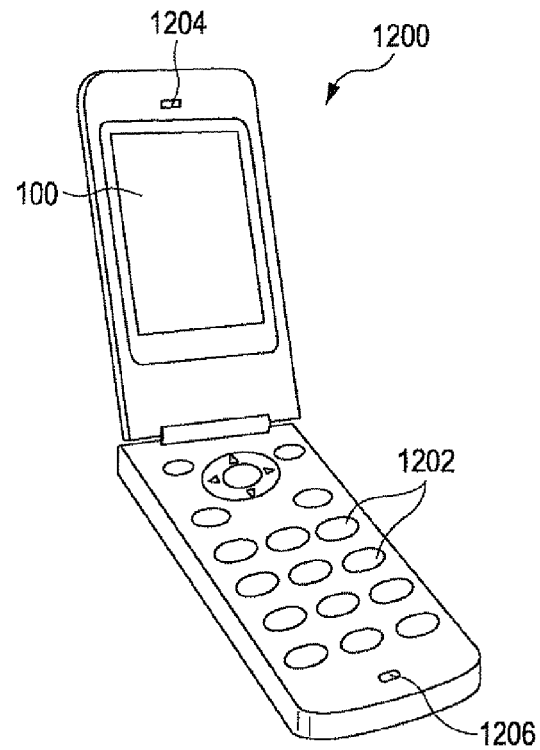
FIG. 6 is a perspective view showing the constitution of a cellular phone (including PHS) to which an electronic apparatus according to an aspect of the invention is applied.

FIG. 6 is a perspective view showing the constitution of a cellular phone (including PHS) to which an electronic apparatus according to an aspect of the invention is applied.

In this figure, a cellular phone 1200 includes plural operation buttons 1202, a receiver 1204, a speaker 1206, and a display portion.

In the cellular phone 1200, the display portion is constituted with the display device 100 as described above.

Figure 7:
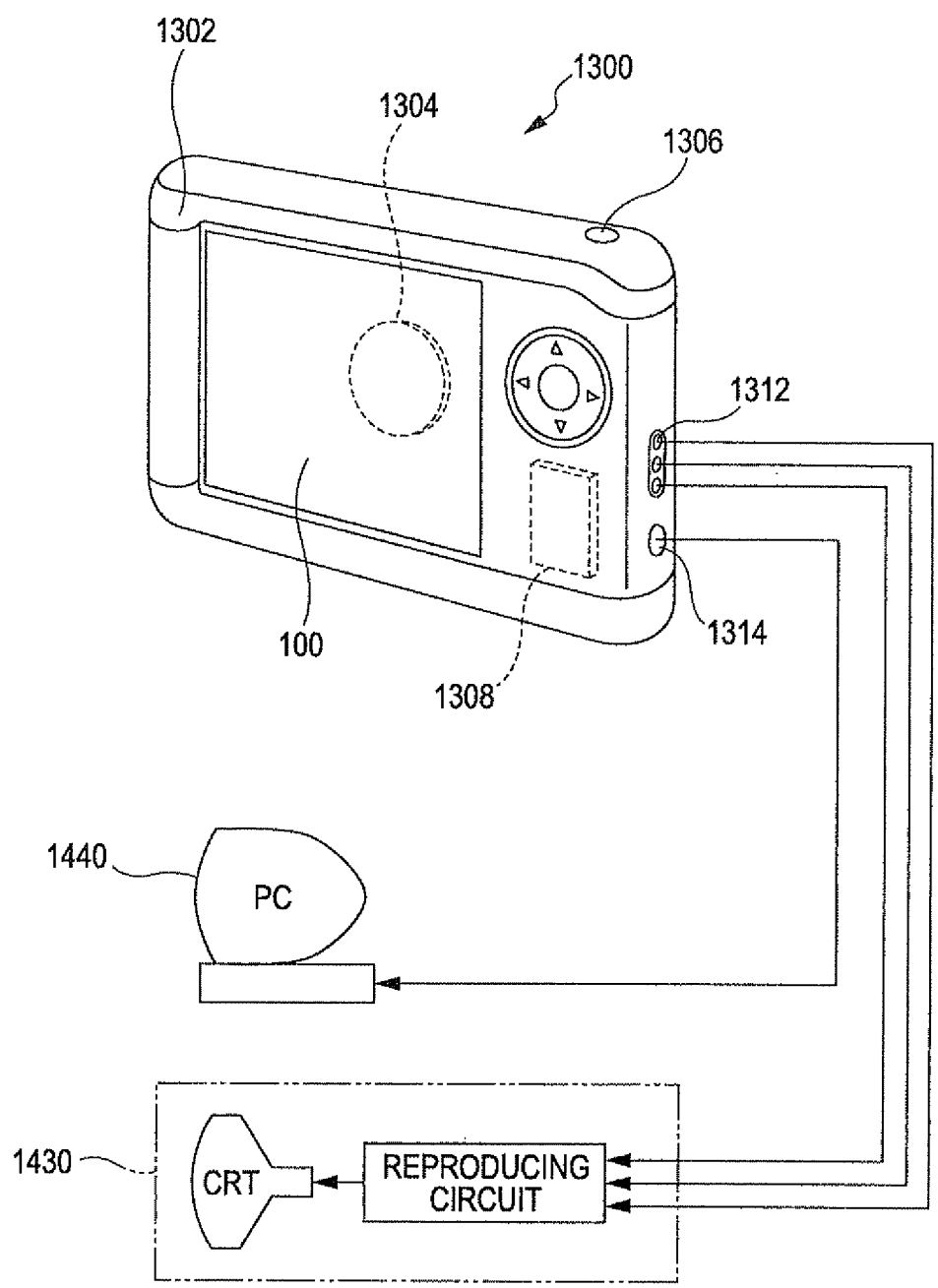
FIG. 7 is a perspective view showing the constitution of a digital still camera to which an electronic apparatus according to an aspect of the invention is applied.

FIG. 7 is a perspective view showing the constitution of a digital still camera to which an electronic apparatus according to an aspect of the invention is applied. Further, in this figure, a simplified diagram of connections to external equipments is also shown.

Here, in contrast to general cameras, in which a silver salt photographic film is exposed to photographic images of objects, a digital still camera 1300 generates imaging signals (image signals) by photoelectric conversion of photographic images of objects using an imaging element such as a CCD (Charge Coupled Device) and the like.

A display portion is provided on the back surface of a case (body) 1302 in the digital still camera 1300, so that it performs display, based on the imaging signals by a CCD, and the display portion serves as a viewfinder that displays objects in the form of electronic images.

In the digital still camera 1300, the display portion is constituted with the display device 100 described above.

A circuit substrate 1308 is installed inside the case. The circuit substrate 1308 carries memory to store (memorize) the imaging signals.

Further, on the front side (the back side in the constitution shown) of the case 1302, provided is a photoreceptor unit 1304 including optical lenses (imaging optical systems), CCDs, and the like.

If a shutter button 1306 is pressed while the image of an object displayed on the display portion is observed by a user, the imaging signals of the CCD at that moment is transferred and stored in the memory on the circuit substrate 1308.

Furthermore, a video signal output terminal 1312 and an input and output terminal 1314 for data communication are arranged on the lateral sides of the case 1302 in the digital still camera 1300. Further, as shown in the figure, the video signal output terminal 1312 and the input and output terminal 1314 for data communication are connected, if required, with a television monitor 1430 and a personal computer 1440, respectively. In addition, a predetermined operation allows imaging signals stored in the memory on the circuit substrate 1308 to be output to the television monitor 1430 or the personal computer 1440.

Since the electronic apparatus as described above includes the display device 100 (light-emitting device 101), it is inexpensive and has excellent reliability.

Further, examples of the application of the electronic apparatus of the invention include televisions, video cameras, viewfinder-type or direct viewing-type video cassette recorders, laptop-type personal computers, car navigation systems, pagers, PDAs (including ones with communication capability), electronic dictionaries, calculators, gaming hardware, word processors, work stations, television phones, security television monitors, electronic binoculars, POS terminals, equipment with touch panels (for example, ATMs and ticket machines), medical devices (for example, electronic thermometers, manometers, blood glucose analyzers, electrocardiography instruments, ultrasonography instruments, and endoscopic monitors), fishfinders, various measurement systems, gauging instruments (for example, ones for automobiles, airplanes, and ships), flight simulators, and projector-type display devices such as other various monitors, projectors, and the like, in addition to the personal computers (mobile personal computers) in FIG. 5, the cellular phones in FIG. 6, or the digital still cameras in FIG. 7.

The film-forming ink, the film-forming method, the liquid droplet discharging device, the method for preparing a light-emitting element, the light-emitting element, the light-emitting device, and the electronic apparatus of the invention are described above, based on the embodiments illustrated, but the invention is not limited thereto.

For example, in the above-described embodiments, it is described that the light-emitting element has three layers of the light-emitting layers, but may have one, two, or four or more layers of the light-emitting layers. For example, in the above-described embodiment, one or two layers of the light-emitting layers in the light-emitting element may be omitted, and additional one or more layers of the light-emitting layer may be added. In addition, the light-emitting color of the light-emitting layer is not limited to the R, G, and B of the above-described embodiment.

Furthermore, in the above-described embodiments, examples in which the light-emitting device is assembled in the display device are described. However, the light-emitting device of an aspect of the invention is not limited thereto, and it can also be used as, for example, electrochromic lighting glass, electronic paper, lighting devices, or a light source of an exposure device in an electrophotographic printer.

Furthermore, in the above-described embodiments, examples in which the film-forming ink and the film-forming method of the invention are applied to preparation of an organic EL element are described, but the film-forming ink and the film-forming method of the invention are not limited thereto and can be applied to various types of film formation using film-forming materials which include π-conjugated processed matter.

EXAMPLES

Next, specific Examples of the invention will be described.
1. Preparation of Light-Emitting Element Example 1

<1> First, a transparent glass substrate of which an average thickness was 0.5 mm was prepared. Subsequently, an ITO electrode (a positive electrode) of which an average thickness was 100 nm was formed by a sputtering method.

Then, the substrate was dipped into acetone and 2-propanol in this order, cleaned with ultrasonic waves, and then subjected to an oxygen plasma treatment.

<2> Next, a hole injecting layer having an average thickness of 50 nm was formed on an ITO electrode.

The hole injecting layer was formed by applying a film-forming ink for forming a hole injecting layer onto an ITO electrode by a liquid droplet discharging method, dried in vacuo, and then subjected to a heating treatment (calcination treatment) at 150° C. for 30 minutes under a nitrogen atmosphere.

For the film-forming ink for forming a hole injecting layer, PEDOT/PSS was used as a film-forming material and water and isopropyl alcohol were used as a liquid medium (dispersion medium).

<3> Next, a hole transporting layer having an average thickness of 50 nm was formed on the hole injecting layer.

The hole transporting layer was formed by applying a film-forming ink for forming a hole transporting layer (the film-forming ink of the aspect of the invention) onto the hole injecting layer by a liquid droplet discharging method using the liquid droplet discharging device as shown in FIG. 2, dried in vacuo, and then subjected to a heating treatment (calcination treatment) at 180° C. for 1 hour under a nitrogen atmosphere. The layer (hole transporting layer) obtained became unnecessary for the organic medium.

For the film-forming ink for forming a hole transporting layer, TFB (0.4 wt %) was used as a film-forming material, and linear pentylbenzene which is a compound represented by the formula (I) was used as a liquid medium (solvent). Further, the viscosity of the film-forming ink was 2.0 cP.

Further, for linear pentylbenzene, in the formula (I), has 5 carbon atoms, and each of $R^2$ to $R^6$ has 0 carbon atom.

When applied onto the hole injecting layer, the film-forming ink could be uniformly wet and spread over thereon.

<4> Next, a green light-emitting layer (first light-emitting layer) having an average thickness of 60 nm was formed on the hole transporting layer.

The green light-emitting layer was formed by applying a film-forming ink for forming a green light-emitting layer onto the hole transporting layer by a liquid droplet discharging method, dried in vacuo, and then subjected to a heating treatment (calcination treatment) at 130° C. for 30 minutes.

For the film-forming ink for forming a green light-emitting layer, F8BT (1.5 wt %) which is a green light-emitting material was used as a film-forming material, and cyclohexylbenzene was used as a liquid medium (solvent).

<5> Next, a Ba layer having an average thickness of 10 nm and an Al layer having an average thickness of 200 nm were laminated sequentially on the green light-emitting layer using a vacuum deposition method (vacuum degree $1.33 \times 10^{-4}$ Pa) to form a negative electrode constituted with a laminate thereof.

By the processes above, a light-emitting element was prepared.

Example 2

In the same manner as in Example 1 except that hexylbenzene which is a compound represented by the formula (I) was used instead of linear pentylbenzene as a liquid medium (solvent) during formation of the hole transporting layer, a light-emitting element was prepared.

Further, for hexylbenzene, in the formula (I), $R^1$ has 6 carbon atoms and each of $R^2$ to $R^6$ has 0 carbon atom.

Example 3

In the same manner as in Example 1 except that heptylbenzene which is a compound represented by the formula (I) was used instead of linear pentylbenzene as a liquid medium (solvent) during formation of the hole transporting layer, a light-emitting element was prepared.

Further, for the heptylbenzene, in the formula (I), $R^1$ has 7 carbon atoms and each of $R^2$ to $R^6$ has 0 carbon atom.

Example 4

In the same manner as in Example 1 except that octylbenzene which is a compound represented by the formula (I) was used instead of linear pentylbenzene as a liquid medium (solvent) during formation of the hole transporting layer, a light-emitting element was prepared.

Further, for octylbenzene, in the formula (I), $R^1$ has 8 carbon atoms and each of $R^2$ to $R^6$ has 0 carbon atom.

Example 5

In the same manner as in Example 1 except that nonylbenzene which is a compound represented by the formula (I) was used instead of linear pentylbenzene as a liquid medium (solvent) during formation of the hole transporting layer, a light-emitting element was prepared.

Further, for nonylbenzene, in the formula (I), $R^1$ has 9 carbon atoms and each of $R^2$ to $R^6$ has 0 carbon atom.

Example 6

In the same manner as in Example 1 except that 1,2-dipropylbenzene which is a compound represented by the formula (I) was used instead of linear pentylbenzene as a liquid medium (solvent) during formation of the hole transporting layer, a light-emitting element was prepared.

Further, for 1,2-dipropylbenzene, in the formula (I), each of $R^1$ and $R^2$ has 3 carbon atoms and each of $R^3$ to $R^6$ has 0 carbon atom.

Example 7

In the same manner as in Example 1 except that 1,2-dibutylbenzene which is a compound represented by the formula (I) was used instead of linear pentylbenzene as a liquid medium (solvent) during formation of the hole transporting layer, a light-emitting element was prepared.

Further, for 1,2-dibutylbenzene, in the formula (I), each of $R^1$ and $R^2$ has 4 carbon atoms and each of $R^3$ to $R^6$ has 0 carbon atom.

Example 8

In the same manner as in Example 1 except that 1,4-dipropylbenzene which is a compound represented by the formula (I) was used instead of linear pentylbenzene as a liquid medium (solvent) during formation of the hole transporting layer, a light-emitting element was prepared.

Further, for 1,4-dipropylbenzene, in the formula (I), each of $R^1$ and $R^4$ has 3 carbon atoms and each of $R^2$, $R^3$, $R^5$ and $R^6$ has 0 carbon atom.

Example 9

In the same manner as in Example 1 except that 1,4-dibutylbenzene which is a compound represented by the formula (I) was used instead of linear pentylbenzene as a liquid medium (solvent) during formation of the hole transporting layer, a light-emitting element was prepared.

Further, for 1,4-dibutylbenzene, in the formula (I), each of $R^1$ and $R^4$ has 4 carbon atoms and each of $R^2$, $R^3$, $R^5$, and $R^6$ has 0 carbon atom.

Example 10

In the same manner as in Example 1 except that 1,2-dipropylbenzene (each n is 3) which is a compound represented by the formula (1) was used instead of linear pentylbenzene as a liquid medium (solvent) during formation of the hole transporting layer, a light-emitting element was prepared.

Further, for 1,2-dipropylbenzene, in the formula (I), each of $R^1$ and $R^2$ is a linear alkyl group having 3 carbon atoms and each of $R^3$, $R^4$, $R^5$, and $R^6$ is hydrogen.

Example 11

In the same manner as in Example 1 except that 1,2-dibutylbenzene (each n is 4) which is a compound represented by the formula (1) was used instead of linear pentylbenzene as a liquid medium (solvent) during formation of the hole transporting layer, a light-emitting element was prepared.

Further, for 1,2-dibutylbenzene, in the formula (I), each of $R^1$ and $R^2$ is a linear alkyl group having 4 carbon atoms and each of $R^3$, $R^4$, $R^5$, and $R^6$ is hydrogen.

Example 12

In the same manner as in Example 1 except that 1,2,4-trimethylbenzene (each n is 1) which is a compound represented by the formula (2) was used instead of linear pentylbenzene as a liquid medium (solvent) during formation of the hole transporting layer, a light-emitting element was prepared.

Further, for e 1,2,4-trimethylbenzene, in the formula (I), each of $R^1$, $R^2$, and $R^4$ is an alkyl group having one carbon atom and each of $R^3$, $R^5$, and $R^6$ is hydrogen.

Example 13

In the same manner as in Example 1 except that 1,2,3-trimethylbenzene (each n is 1) which is a compound represented by the formula (2) was used instead of linear pentylbenzene as a liquid medium (solvent) during formation of the hole transporting layer, a light-emitting element was prepared.

Further, for 1,2,3-trimethylbenzene, in the formula (I), each of $R^1$, $R^2$, and $R^3$ is an alkyl group having one carbon atom and each of $R^4$, $R^5$, and $R^6$ is hydrogen.

Example 14

In the same manner as in Example 1 except that 1,2,3,4-tetramethylbenzene (each n is 1) which is a compound represented by the formula (3) was used instead of linear pentylbenzene as a liquid medium (solvent) during formation of the hole transporting layer, a light-emitting element was prepared.

Further, for 1,2,3,4-tetramethylbenzene, in the formula (I), each of $R^1$, $R^2$, $R^3$, and $R^4$ is an alkyl group having one carbon atom and each of $R^5$ and $R^6$ is hydrogen.

Reference Example 1

In the same manner as in Example 1 except that 1,3,5-trimethylbenzene was used instead of linear pentylbenzene as a liquid medium (solvent) during formation of the hole transporting layer, a light-emitting element was prepared.

Further, for 1,3,5-trimethylbenzene, in the formula (I), each of $R^1$, $R^3$, and $R^5$ is an alkyl group having one carbon atom and each of $R^2$, $R^4$, and $R^6$ is hydrogen.

Reference Example 2

In the same manner as in Example 1 except that 1,3,5-triethylbenzene was used instead of linear pentylbenzene as a liquid medium (solvent) during formation of the hole transporting layer, a light-emitting element was prepared.

Further, for 1,3,5-triethylbenzene, in the formula (I), each of $R^1$, $R^3$, and $R^5$ is an alkyl group having 2 carbon atoms and each of $R^2$, $R^4$, and $R^6$ is hydrogen.

Reference Example 3

In the same manner as in Example 1 except that 1,2,3,5-tetramethylbenzene was used instead of linear pentylbenzene as a liquid medium (solvent) during formation of the hole transporting layer, a light-emitting element was prepared.

Further, for 1,2,3,5-tetramethylbenzene, in the formula (I), each of $R^1$, $R^2$, $R^3$, and $R^5$ is an alkyl group having one carbon atom and each of $R^4$ and $R^6$ is hydrogen.

Reference Example 4

In the same manner as in Example 1 except that 1,2,4,5-tetramethylbenzene was used instead of linear pentylbenzene as a liquid medium (solvent) during formation of the hole transporting layer, a light-emitting element was prepared.

Further, for 1,2,4,5-tetramethylbenzene, in the formula (I), each of $R^1$, $R^2$, $R^4$, and $R^5$ is an alkyl group having one carbon atom and each of $R^3$ and $R^6$ is hydrogen.

Comparative Example

In the same manner as in Example 1 except that cyclohexylbenzene was used instead of linear pentylbenzene as a liquid medium (solvent) during formation of the hole transporting layer, a light-emitting element was prepared.

2. Evaluation

For each of light-emitting elements in the Examples and Comparative Examples, current with a current density of 10 mA/cm$^2$ was flowed into each of the positive electrode and the negative electrode by a direct current source, and then, the amounts of the holes and electrons flowing in the light-emitting layer, and the current efficiency were measured.

The results are shown in Table. Further, in Table, the measurement results of the Comparative Examples were normalized in accordance with the criteria (1) and the measurement results of each Example are presented.

TABLE

| | Evaluation | | |
|---|---|---|---|
| | Amount of carrier in film (light-emitting layer) | | |
| | hole | electron | Current efficiency |
| Example 1 | 9 | 1 | 1.1 |
| Example 2 | 7.8 | 1 | 1.3 |
| Example 3 | 7 | 1 | 1.4 |
| Example 4 | 5 | 1 | 2.0 |
| Example 5 | 2 | 1 | 5.0 |
| Example 6 | 7 | 1 | 1.4 |
| Example 7 | 4 | 1 | 2.5 |
| Example 8 | 7.4 | 1 | 1.4 |
| Example 9 | 4.6 | 1 | 2.2 |
| Example 10 | 7 | 1 | 1.4 |
| Example 11 | 4 | 1 | 2.5 |
| Example 12 | 8 | 1 | 1.3 |
| Example 13 | 8.8 | 1 | 1.1 |

TABLE-continued

| | Evaluation | | |
|---|---|---|---|
| | Amount of carrier in film (light-emitting layer) | | |
| | hole | electron | Current efficiency |
| Example 14 | 7.2 | 1 | 1.4 |
| Reference Example 1 | 9 | 1 | 1.1 |
| Reference Example 2 | 7 | 1 | 1.4 |
| Reference Example 3 | 8.3 | 1 | 1.3 |
| Reference Example 4 | 8 | 1 | 1.3 |
| Comparative Example | 10 | 1 | 1.0 |

As clearly shown in Table, with all the light-emitting elements of each of Examples 1 to 14 and each of Reference Examples 1 to 4, as compared with the light-emitting element in Comparative Example, the hole transporting ability was inhibited and the current efficiency was improved.

Furthermore, from the comparison between each of Examples 10 to 14 and each of Reference Examples 1 to 4, it can be seen that as the asymmetry of the compound included in the liquid medium is higher, the hole transporting ability is inhibited and the current efficiency is improved.

The entire disclosure of Japanese Patent Application No. 2010-187173, filed Aug. 24, 2010 and No. 2010-187174, filed Aug. 24, 2010 are expressly incorporated by reference herein.

What is claimed is:

1. A film-forming ink comprising:
    film-forming materials containing π-conjugated compounds; and
    a liquid medium consisting of a single solvent which is capable of dissolving or dispersing the film-forming material and containing a compound represented by the following formula (I),
    wherein the compound is one in which the substituent of at least one of $R^1$ to $R^6$ is a linear or branched alkyl group, and the molecular structure of the one substituent is larger than the molecular structure of another substituent, and thus, the molecular weight of the whole molecule is biased towards the side where the one substituent is present,
    wherein in the formula (I), $R^1$ and $R^2$ are each independently a linear or branched alkyl group having 3 or 4 carbon atoms, and each of $R^3$, $R^4$, $R^5$ and $R^6$ is hydrogen

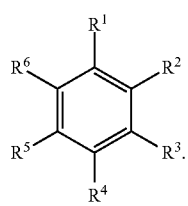

2. The film-forming ink according to claim 1, wherein the film-forming material is a material constituting an organic layer of an organic electroluminescence element, or a precursor thereof.

3. The film-forming ink according to claim 1, which is used to form a film mainly constituted with the film-forming material by applying the film-forming ink to a substrate and removing the single solvent.

4. The film-forming ink according to claim 1, which is used for film formation by a liquid droplet discharging method.

5. A film-forming method comprising:
    applying the film-forming ink according to claim 1 onto a substrate; and
    removing the single solvent from the film-forming ink to form a film.

6. A liquid droplet discharging device comprising a liquid droplet discharging head that discharges the film-forming ink according to claim 1.

7. A film-forming ink comprising:
    film-forming materials containing π-conjugated compounds; and
    a liquid medium consisting of a single solvent which is capable of dissolving or dispersing the film-forming material and containing a compound represented by the following formula (I),
    wherein the compound is one in which the substituent of at least one of $R^1$ to $R^6$ is a linear or branched alkyl group, and the molecular structure of the one substituent is larger than the molecular structure of another substituent, and thus, the molecular weight of the whole molecule is biased towards the side where the one substituent is present,

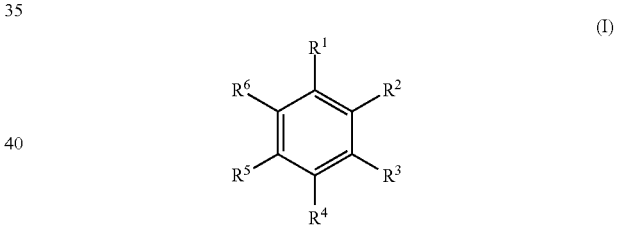

wherein in the formula (I), $R^1$ is a linear alkyl group having 6 to 10 carbon atoms, $R^4$ is an alkyl group having one carbon atom and at least two of $R^2$, $R^3$, $R^5$ and $R^6$ are hydrogen.

8. A method for preparing a light-emitting element, comprising:
    applying the film-forming ink according to claim 1 onto a substrate; and
    removing the single solvent from the film-forming ink to form a film.

9. A light-emitting element prepared using the method for preparing a light-emitting element according to claim 8.

10. A light-emitting device comprising the light-emitting element according to claim 9.

11. An electronic apparatus comprising the light-emitting device according to claim 10.

* * * * *